(12) United States Patent
Moriya et al.

(10) Patent No.: US 7,748,138 B2
(45) Date of Patent: Jul. 6, 2010

(54) PARTICLE REMOVAL METHOD FOR A SUBSTRATE TRANSFER MECHANISM AND APPARATUS

(75) Inventors: Tsuyoshi Moriya, Nirasaki (JP); Hiroyuki Nakayama, Nirasaki (JP); Kikuo Okuyama, Higashihiroshima (JP); Manabu Shimada, Higashihiroshima (JP)

(73) Assignee: Tokyo Electron Limited, Tokyo (JP)

( * ) Notice: Subject to any disclaimer, the term of this patent is extended or adjusted under 35 U.S.C. 154(b) by 1042 days.

(21) Appl. No.: 11/128,256

(22) Filed: May 13, 2005

(65) Prior Publication Data

US 2005/0252455 A1 Nov. 17, 2005

Related U.S. Application Data

(60) Provisional application No. 60/589,810, filed on Jul. 22, 2004, provisional application No. 60/635,942, filed on Dec. 15, 2004.

(30) Foreign Application Priority Data

May 13, 2004 (JP) ............................. 2004-144013
Oct. 29, 2004 (JP) ............................. 2004-316921

(51) Int. Cl.
*F26B 3/00* (2006.01)
*B65H 1/00* (2006.01)
*C23F 1/00* (2006.01)
*C23C 16/00* (2006.01)

(52) U.S. Cl. .......................... 34/497; 34/443; 414/806; 156/345.31; 118/719

(58) Field of Classification Search ................... 134/19; 118/719; 156/345.31, 345.32; 414/935–941
See application file for complete search history.

(56) References Cited

U.S. PATENT DOCUMENTS

| 5,013,366 A | * | 5/1991 | Jackson et al. ................. 134/1 |
| 5,855,618 A | | 1/1999 | Patnaik et al. |
| 5,923,966 A | | 7/1999 | Teramoto et al. |

FOREIGN PATENT DOCUMENTS

| CN | 1320954 A | | 11/2001 |
| EP | 401035 A2 | * | 12/1990 |
| JP | 11-354503 | | 12/1999 |
| JP | 11354503 A | * | 12/1999 |

\* cited by examiner

*Primary Examiner*—Karla Moore
(74) *Attorney, Agent, or Firm*—Oblon, Spivak, McClelland, Maier & Neustadt, L.L.P.

(57) ABSTRACT

A substrate transfer mechanism for transferring a substrate includes a mounting table on which the substrate is mounted; an arm member connected to the mounting table and moving it. The substrate transfer mechanism further includes a temperature control unit for controlling temperature of the mounting table, wherein the temperature control unit forms a temperature gradient in the mounting table. The temperature control unit includes a detector for detecting temperature in an environment or a chamber in which the substrate transfer mechanism is installed a heater for heating the mounting table and a controller for controlling an operation of the heater based on the temperature in the environment or the chamber detected by the detector.

7 Claims, 14 Drawing Sheets

US 7,748,138 B2

PARTICLE REMOVAL METHOD FOR A SUBSTRATE TRANSFER MECHANISM AND APPARATUS

CROSS-REFERENCE TO RELATED APPLICATIONS

This document claims priority to Japanese Patent Application Nos. 2004-144013, filed May 13, 2004 and 2004-316921, filed Oct. 29, 2004, and U.S. Provisional Application Nos. 60/589,810, filed Jul. 22, 2004 and 60/635,942, filed Dec. 15, 2004, the entire content of which are hereby incorporated by reference.

FIELD OF THE INVENTION

The present invention relates to a substrate transfer mechanism, a substrate transfer apparatus including the substrate transfer mechanism, a particle removal method for each of the substrate transfer mechanism and apparatus, a program for executing the method, and a storage medium for storing the program; and, more particularly, to a substrate transfer mechanism for transferring a substrate to a desired position in order to perform a film forming process, an etching process and the like on the substrate, a substrate transfer apparatus including the substrate transfer mechanism, a particle removal method for each of the substrate transfer mechanism and apparatus, a program for executing the method, and a storage medium for storing the program.

BACKGROUND OF THE INVENTION

Conventionally, as a substrate processing system for performing various plasma processing, such as an ion doping process, a film forming process and an etching process, on a substrate, there has been known a cluster type substrate processing system wherein plural processing apparatuses are disposed radially around a common substrate transfer chamber.

Such a cluster type substrate processing system, as shown in FIG. 15A, includes, e.g., two substrate processing apparatuses 151 for processing a substrate; a loader module 152 for transferring the substrate from a substrate cassette (not shown); two substrate loading/unloading chambers 153 for performing loading/unloading of the substrate into/from the loader module 152; and a substrate transfer chamber 154 as the substrate transfer apparatus disposed between the substrate processing apparatus 151 and the substrate loading/unloading chamber 153. (see, e.g., U.S. Pat. No. 5,855,681)

The substrate transfer chamber 154, as shown in FIG. 15B, has a gas introduction unit 155 for introducing a gas thereinto and a pumping unit 156 for exhausting the inside thereof to vacuum. Further, in the substrate transfer chamber 154, there is provided a handling device 157 as a substrate transfer mechanism for transferring the substrate, and a gate valve 158 that can be freely opened and closed is installed at a side wall thereof contacting with the substrate processing apparatus 151 or the substrate loading/unloading chamber 153. The handling device 157 is a scalar arm type handling device having a plurality of arm members and a rotation table, and transfers the substrate into the substrate processing apparatus 151 or the substrate loading/unloading chamber 153 via the gate valve 158.

However, in case the substrate is continuously processed by using the aforementioned cluster type substrate processing system, when the handling unit 157 transfers the substrate, particles transferred into the substrate transfer chamber 154 by the handling unit 157 together with the substrate and/or particles, cut powder, produced upon the operation of the handling unit 157 are attached to the substrate. As a result, for example, in an etching process, the attached particles serve as a mask to cause an etching deficiency. Further, in a film forming process, the attached particles serve as a core to grow, resulting in deterioration in quality of film.

SUMMARY OF THE INVENTION

It is, therefore, an object of the present invention to provide a substrate transfer mechanism capable of detaching and removing particles attached to the substrate, a substrate transfer apparatus including the substrate transfer mechanism, a particle removal method for each of the substrate transfer mechanism and apparatus, a program for executing the method, and a storage medium for storing the program.

In accordance with one aspect of the present invention, there is provided a substrate transfer mechanism for transferring a substrate, including: a mounting table on which the substrate is mounted; an arm member connected to the mounting table, the arm member moving the mounting table; and a temperature control unit for controlling temperature of the mounting table, wherein the temperature control unit forms a temperature gradient in the mounting table.

With such a substrate transfer mechanism, since there is formed a temperature gradient in the mounting table on which the substrate is mounted, the particles are detached from the substrate due to a thermal stress produced at the interface between the substrate and each particle, and are removed from the substrate by a thermophoretic force applied thereto in a direction moving away from the substrate.

Preferably, the temperature control unit includes a detector for detecting temperature of an environment, a heater for heating the mounting table and a controller for controlling an operation of the heater based on the temperature of the environment detected by the detector.

With such configurations, the mounting table is heated based on the detected environment temperature, so that the particles attached to the substrate can be assured to be detached and removed.

Preferably, the controller controls the temperature of the mounting table to be kept at a temperature higher by at least 30 K than that of the environment.

With such configurations, since the temperature of the mounting table is controlled to be kept at a temperature higher by at least 30 K than that of the environment, the particles can be further assured to be detached and removed.

Preferably, the mounting table has a surface layer formed of a specific material, and a linear expansion coefficient of the material of the surface layer is different from that of the particles produced in the vicinity of the mounting table.

With such configurations, since the linear expansion coefficient of the material of the surface layer in the mounting table is different from that of the particles produced in the vicinity of the mounting table, a thermal stress produced at the interface between the mounting table and each particle can be increased, thereby facilitating the detachment and removal of the particles attached to the mounting table.

In accordance with another aspect of the present invention, there is provided a substrate transfer apparatus including a chamber for accommodating a substrate; a substrate transfer mechanism, installed in the chamber, for transferring the substrate; an exhaust unit for exhausting the inside of the chamber; a gas introduction unit for introducing a gas into the chamber, wherein the substrate transfer mechanism includes: a mounting table on which the substrate is mounted; an arm member connected to the mounting table, the arm member moving the mounting table; and a temperature control unit for controlling temperature of the mounting table, the temperature control unit forming a temperature gradient in the mounting table.

With such a substrate transfer apparatus, since there is formed a temperature gradient in the mounting table on which the substrate is mounted, the particles are detached from the substrate due to a thermal stress produced at the interface between the substrate and each particle, and are removed from the substrate by a thermophoretic force applied thereto in a direction moving away from the substrate.

Preferably, the temperature control unit includes a detector for detecting temperature in the chamber, a heater for heating the mounting table and a controller for controlling an operation of the heater based on the temperature in the chamber detected by the detector.

Preferably, the controller controls the temperature of the mounting table to be kept at a temperature higher by at least 30 K than that in the chamber.

Preferably, the gas introduction unit has a gas temperature control unit for controlling temperature of a gas introduced into the chamber based on the temperature in the chamber detected by the detector.

Preferably, the substrate transfer apparatus further includes a pressure control unit for controlling pressure in the chamber.

Preferably, the pressure control unit controls the pressure in the chamber to be kept at $1.3 \times 10^{-2} \sim 1.3$ kPa (0.1~10 Torr).

Preferably, the mounting table has a surface layer formed of a specific material, and a linear expansion coefficient of the material of the surface layer is different from that of the particles produced in the vicinity of the mounting table.

In accordance with still another aspect of the present invention, there is provided a substrate transfer mechanism for transferring a substrate, including: a mounting table on which the substrate is mounted; an arm member connected to the mounting table, the arm member moving the mounting table; a vibrator for generating ultrasonic vibrations; and an oscillator connected to the vibrator and secured to the mounting table.

With such a substrate transfer mechanism, since the ultrasonic vibrations are applied to the mounting table and hence the substrate mounted thereon, the bonding strength between the substrate and the particles becomes weak, so that the particles can be detached and removed from the substrate.

In accordance with still another aspect of the present invention, there is provided a substrate transfer apparatus including a chamber for accommodating a substrate; a substrate transfer mechanism, installed in the chamber, for transferring the substrate; an exhaust unit for exhausting the inside of the chamber; a gas introduction unit for introducing a gas into the chamber, wherein the substrate transfer mechanism includes: a mounting table on which the substrate is mounted; an arm member connected to the mounting table, the arm member moving the mounting table; a vibrator for generating ultrasonic vibrations; and an oscillator connected to the vibrator and secured to the mounting table.

With such a substrate transfer apparatus, since the ultrasonic vibrations are applied to the mounting table and hence the substrate mounted thereon, the bonding strength between the substrate and the particles becomes weak, so that the particles can be detached and removed from the substrate.

In accordance with still another aspect of the present invention, there is provided a substrate transfer mechanism for transferring a substrate, including: a mounting table on which the substrate is mounted; an arm member connected to the mounting table, the arm member moving the mounting table; a temperature control unit for controlling temperature of the mounting table, the temperature control unit forming a temperature gradient in the chamber; a vibrator for generating ultrasonic vibrations; and an oscillator connected to the vibrator and secured to the mounting table.

With such a substrate transfer mechanism, since there is formed in a temperature gradient in the mounting table on which the substrate is mounted and the ultrasonic vibrations are applied to the mounting table, the particles are detached from the substrate due to the thermal stress produced at the interface between the substrate and each particle, and are removed from the substrate W by the thermophoretic force applied thereto in a direction moving away from the substrate. Further, the bonding strength between the substrate and the particles becomes weak due to the application of ultrasonic vibrations to the substrate, so that the particles can be assured to be detached and removed from the substrate.

Preferably, the temperature control unit includes a detector for detecting temperature of an environment, a heater for heating the mounting table and a controller for controlling an operation of the heater based on the temperature of the environment detected by the detector.

Preferably, the controller controls the temperature of the mounting table to be kept at a temperature higher by at least 30 K than that of the environment.

Preferably, the mounting table has a surface layer formed of a specific material, and a linear expansion coefficient of the material of the surface layer is different from that of the particles produced in the vicinity of the mounting table.

In accordance with still another aspect of the present invention, there is provided a substrate transfer apparatus including a chamber for accommodating a substrate; a substrate transfer mechanism, installed in the chamber, for transferring the substrate; an exhaust unit for exhausting the inside of the chamber; a gas introduction unit for introducing a gas into the chamber, wherein the substrate transfer mechanism includes: a mounting table on which the substrate is mounted; an arm member connected to the mounting table, the arm member moving the mounting table; a temperature control unit for controlling temperature of the mounting table, the temperature control unit forming a temperature gradient in the mounting table; a vibrator for generating ultrasonic vibrations; and an oscillator connected to the vibrator and secured to the mounting table.

With such a substrate transfer apparatus, since there is formed in a temperature gradient in the mounting table on which the substrate is mounted and the ultrasonic vibrations are applied to the mounting table, the particles are detached from the substrate due to the thermal stress produced at the interface between the substrate and each particle, and are removed from the substrate W by the thermophoretic force applied thereto in a direction moving away from the substrate. Further, the bonding strength between the substrate and the particles becomes weak due to the application of ultrasonic vibrations to the substrate, so that the particles can be assured to be detached and removed from the substrate.

Preferably, the temperature control unit includes a detector for detecting temperature in the chamber, a heater for heating the mounting table and a controller for controlling an operation of the heater based on the temperature in the chamber detected by the detector.

Preferably, the controller controls the temperature of the mounting table to be kept at a temperature higher by at least 30 K than that in the chamber.

Preferably, the gas introduction unit has a gas temperature control unit for controlling temperature of a gas introduced into the chamber based on the temperature in the chamber detected by the detector.

Preferably, the substrate transfer apparatus further includes a pressure control unit for controlling pressure in the chamber.

Preferably, the pressure control unit controls the pressure in the chamber to be $1.3 \times 10^{-2} \sim 1.3$ kPa (0.1~10 Torr) Preferably, the mounting table has a surface layer formed of a specific material, and a linear expansion coefficient of the material of the surface layer is different from that of the particles produced in the vicinity of the mounting table.

In accordance with still another aspect of the present invention, there is provided a substrate transfer apparatus including a chamber for accommodating a substrate, a mounting table installed in the chamber, the substrate being mounted on the mounting table, an exhaust unit for exhausting the inside of the chamber, and a gas introduction unit for introducing a gas into the chamber, the apparatus including: a temperature control unit for controlling temperature of the mounting table, wherein the temperature control unit forms a temperature gradient in the mounting table.

With such a substrate transfer apparatus, since there is formed a temperature gradient in the mounting table on which the substrate is mounted, the particles are detached from the substrate due to a thermal stress produced at the interface between the substrate and each particle, and are removed from the substrate by a thermophoretic force applied thereto in a direction moving away from the substrate. Accordingly, the particles attached to the substrate can be assured to be detached and removed.

Preferably, the temperature control unit includes a detector for detecting temperature in the chamber, a heater for heating the mounting table and a controller for controlling an operation of the heater based on the temperature in the chamber detected by the detector.

Preferably, the controller controls the temperature of the mounting table to be kept at a temperature higher by at least 30 K than that in the chamber.

Preferably, the gas introduction unit has a gas temperature control unit for controlling temperature of a gas introduced into the chamber based on the temperature in the chamber detected by the detector.

Preferably, the substrate transfer apparatus further includes a pressure control unit for controlling pressure in the chamber.

Preferably, the pressure control unit controls the pressure in the chamber to be $1.3 \times 10^{-2} \sim 1.3$ kPa (0.1~10 Torr).

Preferably, the mounting table has a surface layer formed of a specific material, and a linear expansion coefficient of the material of the surface layer is different from that of the particles produced in the vicinity of the mounting table.

In accordance with still another aspect of the present invention, there is provided a particle removal method for a substrate transfer mechanism including a mounting table on which a substrate is mounted and an arm member connected to the mounting table, the arm member moving the mounting table, the method including: a temperature control step for controlling temperature of the mounting table, wherein at the temperature control step, a temperature gradient is formed in the mounting table.

With such a particle removal method, since there is formed a temperature gradient in the mounting table on which the substrate is mounted, the particles are detached from the substrate due to a thermal stress produced at the interface between the substrate and each particle, and are removed from the substrate by a thermophoretic force applied thereto in a direction moving away from the substrate.

Preferably, the temperature control step includes a detection step for detecting temperature of an environment and a heating step for heating the mounting table based on the temperature of the environment detected at the detecting step.

With such configurations, the mounting table is heated based on the detected environment temperature, so that the particles attached to the substrate can be assured to be detached and removed.

Preferably, wherein at the temperature control step, the temperature of the mounting table is controlled to be kept at a temperature higher by at least 30 K than that of the environment.

With such configurations, since the temperature of the mounting table is controlled to be kept at a temperature higher by at least 30 K than that of the environment, the particles can be further assured to be detached and removed.

Preferably, the mounting table has a surface layer formed of a specific material, and a linear expansion coefficient of the material of the surface layer is different from that of the particles produced in the vicinity of the mounting table.

In accordance with still another aspect of the present invention, there is provided a particle removal method for a substrate transfer apparatus including a chamber for accommodating a substrate; a substrate transfer mechanism having a mounting table installed in the chamber, the substrate being mounted on the mounting table, and an arm member connected to the mounting table, the arm member moving the mounting table; an exhaust unit for exhausting the inside of the chamber; and a gas introduction unit for introducing a gas into the chamber, the method including: a temperature control step for controlling temperature of the mounting table, wherein at the temperature control step, a temperature gradient is formed in the mounting table.

With such a particle removal method, since there is formed a temperature gradient in the mounting table on which the substrate is mounted, the particles are detached from the substrate due to a thermal stress produced at the interface between the substrate and each particle, and are removed from the substrate by a thermophoretic force applied thereto in a direction moving away from the substrate.

Preferably, the temperature control step includes a detection step for detecting temperature in the chamber and a heating step for heating the mounting table based on the temperature in the chamber detected at the detecting step.

Preferably, at the temperature control step, the temperature of the mounting table is controlled to be kept at a temperature higher by at least 30 K than that in the chamber.

Preferably, the particle removal method further includes a gas temperature control step of controlling temperature of a gas introduced into the chamber based on the temperature in the chamber detected at the detection step.

Preferably, the particle removal method further includes a pressure control step of controlling pressure in the chamber.

Preferably, at the pressure control step, the pressure in the chamber is controlled to be $1.3 \times 10^{-2} \sim 1.3$ kPa (0.1~10 Torr).

Preferably, the mounting table has a surface layer formed of a specific material, and a linear expansion coefficient of the material of the surface layer is different from that of the particles produced in the vicinity of the mounting table.

In accordance with still another aspect of the present invention, there is provided a particle removal method for a substrate transfer mechanism including a mounting table on which a substrate is mounted and an arm member connected to the mounting table, the arm member moving the mounting table, the method including: a vibration applying step of applying ultrasonic vibrations to the mounting table.

With such a particle removal method, since the ultrasonic vibrations are applied to the mounting table and hence the substrate mounted thereon, the bonding strength between the substrate and the particles becomes weak, so that the particles can be detached and removed from the substrate.

In accordance with still another aspect of the present invention, there is provided a particle removal method for a substrate transfer apparatus including a chamber for accommodating a substrate; a substrate transfer mechanism having a mounting table installed in the chamber, the substrate being mounted on the mounting table, and an arm member connected to the mounting table, the arm member moving the mounting table; an exhaust unit for exhausting the inside of the chamber; and a gas introduction unit for introducing a gas into the chamber, the method including: a vibration applying step for applying ultrasonic vibrations to the mounting table.

With such a particle removal method, since the ultrasonic vibrations are applied to the mounting table and hence the substrate mounted thereon, the bonding strength between the substrate and the particles becomes weak, so that the particles can be detached and removed from the substrate.

In accordance with still another aspect of the present invention, there is provided a particle removal method for a substrate transfer mechanism including a mounting table on which a substrate is mounted and an arm member connected to the mounting table, the arm member moving the mounting table, the method including: a temperature control step for controlling temperature of the mounting table; and a vibration applying step for applying ultrasonic vibrations to the mounting table, wherein at the temperature control step, a temperature gradient is formed in the mounting table.

With such a particle removal method, since there is formed in a temperature gradient in the mounting table on which the substrate is mounted and the ultrasonic vibrations are applied to the mounting table, the particles are detached from the substrate due to the thermal stress produced at the interface between the substrate and each particle, and are removed from the substrate W by the thermophoretic force applied thereto in a direction moving away from the substrate. Further, the bonding strength between the substrate and the particles becomes weak due to the application of ultrasonic vibrations to the substrate, so that the particles can be assured to be detached and removed from the substrate.

Preferably, the mounting table has a surface layer formed of a specific material, and a linear expansion coefficient of the material of the surface layer is different from that of the particles produced in the vicinity of the mounting table.

In accordance with still another aspect of the present invention, there is provided a particle removal method for a substrate transfer apparatus including a chamber for accommodating a substrate; a substrate transfer mechanism having a mounting table installed in the chamber, the substrate being mounted on the mounting table, and an arm member connected to the mounting table, the arm member moving the mounting table; an exhaust unit for exhausting the inside of the chamber; and a gas introduction unit for introducing a gas into the chamber, the method including: a temperature control step for controlling temperature of the mounting table; and a vibration applying step for applying ultrasonic vibrations to the mounting table, wherein at the temperature control step, a temperature gradient is formed in the mounting table.

With such a particle removal method, since there is formed in a temperature gradient in the mounting table on which the substrate is mounted and the ultrasonic vibrations are applied to the mounting table, the particles are detached from the substrate due to the thermal stress produced at the interface between the substrate and each particle, and are removed from the substrate W by the thermophoretic force applied thereto in a direction moving away from the substrate. Further, the bonding strength between the substrate and the particles becomes weak due to the application of ultrasonic vibrations to the substrate, so that the particles can be assured to be detached and removed from the substrate.

Preferably, the mounting table has a surface layer formed of a specific material, and a linear expansion coefficient of the material of the surface layer is different from that of the particles produced in the vicinity of the mounting table.

In accordance with still another aspect of the present invention, there is provided a particle removal method for a substrate transfer apparatus including a chamber for accommodating a substrate, a mounting table installed in the chamber, the substrate being mounted on the mounting table, an exhaust unit for exhausting the inside of the chamber; and a gas introduction unit for introducing a gas into the chamber, the method including: a temperature control step of controlling temperature of the mounting table, wherein at the temperature control step, a temperature gradient is formed in the mounting table.

With such a particle removal method, since there is formed a temperature gradient in the mounting table on which the substrate is mounted, the particles are detached from the substrate due to a thermal stress produced at the interface between the substrate and each particle, and are removed from the substrate by a thermophoretic force applied thereto in a direction moving away from the substrate. Accordingly, the particles attached to the substrate can be assured to be detached and removed.

Preferably, the temperature control step includes a detection step for detecting temperature in the chamber and a heating step of heating the mounting table based on the temperature in the chamber detected at the detecting step.

Preferably, at the temperature control step, the temperature of the mounting table is controlled to be kept at a temperature higher by at least 30 K than that in the chamber.

Preferably, the particle removal method further includes a gas temperature control step of controlling temperature of a gas introduced into the chamber based on the temperature in the chamber detected at the detection step.

Preferably, the particle removal method further includes a pressure control step of controlling pressure in the chamber.

Preferably, at the pressure control step, the pressure in the chamber is controlled to be $1.3 \times 10^{-2}$~1.3 kPa (0.1~10 Torr).

Preferably, the mounting table has a surface layer formed of a specific material, and a linear expansion coefficient of the material of the surface layer is different from that of the particles produced in the vicinity of the mounting table.

In accordance with still another aspect of the present invention, there is provided a program for executing in a computer a particle removal method for a substrate transfer mechanism including a mounting table on which a substrate is mounted and an arm member connected to the mounting table, the arm member moving the mounting table, the program including: a temperature control module for controlling temperature of the mounting table, wherein at the temperature control module, a temperature gradient is formed in the mounting table, and the temperature control module includes a detection module for detecting temperature of an environment and a heating module for heating the mounting table based on the temperature of the environment detected at the detection module.

With such a program, since there is formed in the mounting table on which the substrate is mounted and the mounting table is heated based on the detected temperature of the environment, the particles are detached from the substrate due to a thermal stress produced at the interface between the substrate and each particle, and are removed from the substrate by a thermophoretic force applied thereto in a direction moving away from the substrate. Accordingly, the particles attached to the substrate can be assured to be detached and removed.

In accordance with still another aspect of the present invention, there is provided a program for executing in a computer a particle removal method for a substrate transfer apparatus including a chamber for accommodating a substrate; a substrate transfer mechanism having a mounting table installed in the chamber, the substrate being mounted on the mounting table, and an arm member connected to the mounting table, the arm member moving the mounting table; an exhaust unit for exhausting the inside of the chamber; and a gas introduction unit for introducing a gas into the chamber, the program including: a temperature control module for controlling temperature of the mounting table, wherein at the temperature control module, a temperature gradient is formed in the mounting table, and the temperature control module includes a detection module for detecting temperature in the chamber; and a gas temperature control module for controlling temperature of a gas introduced into the chamber based on the temperature in the chamber detected at the detection module.

With such a program, since there is formed in the mounting table on which the substrate is mounted and the temperature of the introduced gas is controlled based on the detected temperature in the chamber, the particles are detached from the substrate due to a thermal stress produced at the interface between the substrate and each particle, and are removed from the substrate by a thermophoretic force applied thereto in a direction moving away from the substrate. In addition, even if the mounting table cannot be heated up to a desired temperature, it is possible to form a temperature gradient in the vicinity of the mounting table. Accordingly, the particles attached to the substrate can be assured to be detached and removed.

Preferably, the program further includes a pressure control module for controlling pressure in the chamber.

With such configurations, since the pressure in the chamber is controlled, the particles attached to the substrate can be further assured to be detached by the thermophoretic force depending on the pressure in the chamber.

In accordance with still another aspect of the present invention, there is provided a program for executing in a computer a particle removal method for a substrate transfer mechanism including a mounting table on which a substrate is mounted and an arm member connected to the mounting table, the arm member moving the mounting table, the program including: a temperature control module for controlling temperature of the mounting table; and a vibration applying module for applying ultrasonic vibrations to the mounting table, wherein at the temperature control module, a temperature gradient is formed in the mounting table.

With such a program, since there is formed in a temperature gradient in the mounting table on which the substrate is mounted and the ultrasonic vibrations are applied to the mounting table, the particles are detached from the substrate due to the thermal stress produced at the interface between the substrate and each particle, and are removed from the substrate by the thermophoretic force applied thereto in a direction moving away from the substrate. Further, the bonding strength between the substrate and the particles becomes weak due to the application of ultrasonic vibrations to the substrate, so that the particles can be assured to be detached and removed from the substrate.

In accordance with still another aspect of the present invention, there is provided a storage medium for storing a program executing in a computer a particle removal method for a substrate transfer mechanism including a mounting table on which a substrate is mounted and an arm member connected to the mounting table, the arm member moving the mounting table, wherein the program includes: a temperature control module for controlling temperature of the mounting table, wherein at the temperature control module, a temperature gradient is formed in the mounting table, and the temperature control module includes a detection module for detecting temperature of an environment and a heating module for heating the mounting table based on the temperature of the environment detected at the detection module.

With such a storage medium, since there is formed in the mounting table on which the substrate is mounted and the mounting table is heated based on the detected temperature of the environment, the particles are detached from the substrate due to a thermal stress produced at the interface between the substrate and each particle, and are removed from the substrate by a thermophoretic force applied thereto in a direction moving away from the substrate. Accordingly, the particles attached to the substrate can be assured to be detached and removed.

In accordance with still another aspect of the present invention, there is provided a storage medium for storing a program executing in a computer a particle removal method for a substrate transfer apparatus including a chamber for accommodating a substrate; a substrate transfer mechanism having a mounting table installed in the chamber, the substrate being mounted on the mounting table, and an arm member connected to the mounting table, the arm member moving the mounting table; an exhaust unit for exhausting the inside of the chamber; and a gas introduction unit for introducing a gas into the chamber, wherein the program includes: a temperature control module for controlling temperature of the mounting table, wherein at the temperature control module, a temperature gradient is formed in the mounting table, and the temperature control module includes a detection module for detecting temperature in the chamber; and a gas temperature control module for controlling temperature of a gas introduced into the chamber based on the temperature in the chamber detected at the detection module.

With such a storage medium, since there is formed in the mounting table on which the substrate is mounted and the temperature of the introduced gas is controlled based on the detected temperature in the chamber, the particles are detached from the substrate due to a thermal stress produced at the interface between the substrate and each particle, and are removed from the substrate by a thermophoretic force applied thereto in a direction moving away from the substrate. In addition, even if the mounting table cannot be heated up to a desired temperature, it is possible to form a temperature gradient in the vicinity of the mounting table. Accordingly, the particles attached to the substrate can be assured to be detached and removed.

Preferably, in the storage medium, the program further includes a pressure control module for controlling pressure in the chamber.

In accordance with still another aspect of the present invention, there is provided a storage medium for storing a program executing in a computer a particle removal method for a substrate transfer mechanism including a mounting table on which a substrate is mounted and an arm member connected to the mounting table, the arm member moving the mounting table, wherein the program includes: a temperature control module for controlling temperature of the mounting table; and a vibration applying module for applying ultrasonic vibrations to the mounting table, wherein at the temperature control module, a temperature gradient is formed in the mounting table.

With such a storage medium, since there is formed in a temperature gradient in the mounting table on which the substrate is mounted and the ultrasonic vibrations are applied to the mounting table, the particles are detached from the substrate due to the thermal stress produced at the interface between the substrate and each particle, and are removed from the substrate W by the thermophoretic force applied thereto in a direction moving away from the substrate. Further, the bonding strength between the substrate and the particles becomes weak due to the application of ultrasonic vibrations to the substrate, so that the particles can be assured to be detached and removed from the substrate.

BRIEF DESCRIPTION OF THE DRAWINGS

The above and other objects and features of the present invention will become apparent from the following description of preferred embodiments, given in conjunction with the accompanying drawings, in which:

FIGS. 15A and 15B are schematic views showing configurations of a conventional cluster substrate processing system including a scalar arm type handling device, wherein FIG. 15A is a horizontal sectional view of the cluster substrate processing system and FIG. 15B is a cross sectional view taken along the VI-VI line in FIG. 15A.

DETAILED DESCRIPTION OF THE PREFERRED EMBODIMENTS

Hereinafter, there will be described preferred embodiments of the present invention with reference to the drawings.

Figure 1:
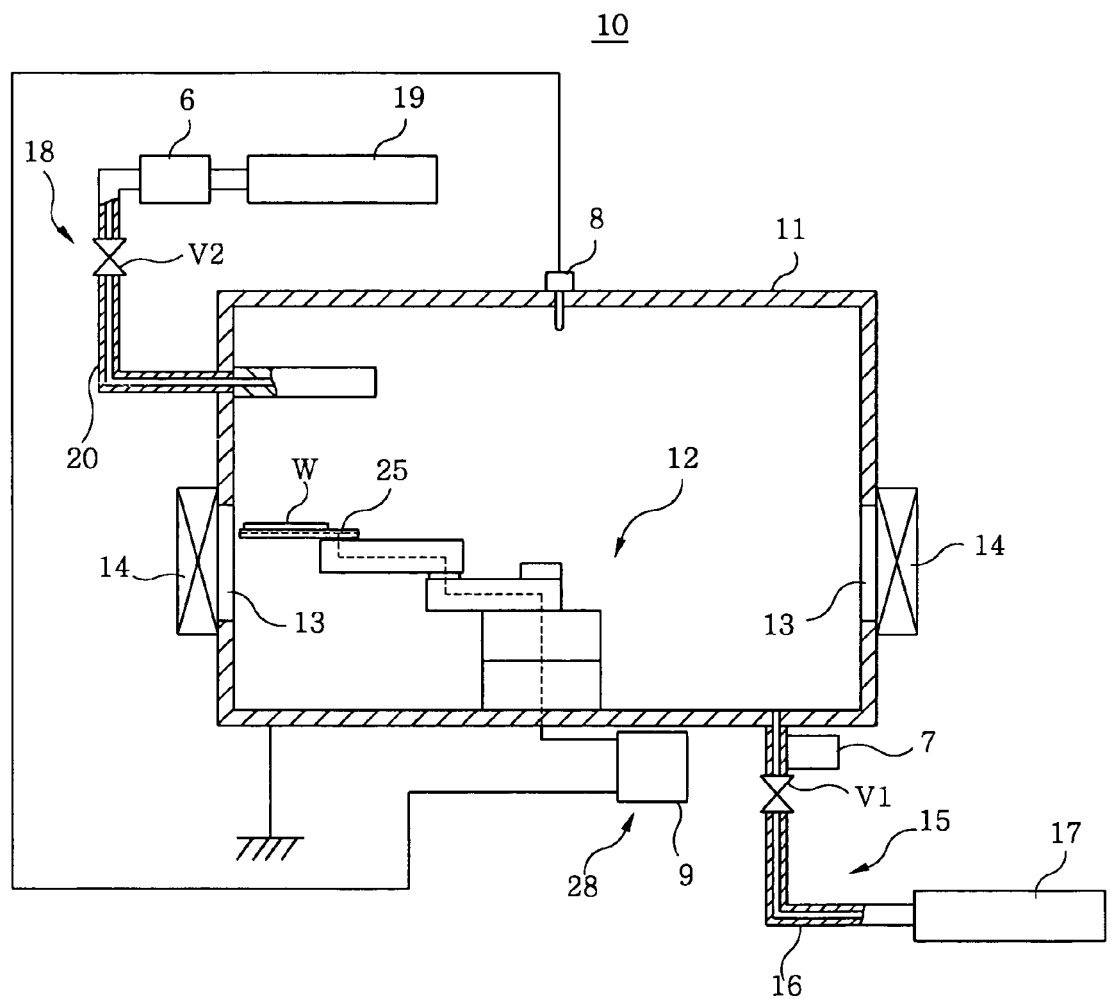
FIG. 1 is a schematic view showing configurations of a substrate transfer apparatus in accordance with a first preferred embodiment of the present invention.

FIG. 1 is a schematic view showing configurations of a substrate transfer apparatus in accordance with a first preferred embodiment of the present invention.

In FIG. 1, the substrate transfer apparatus 10 includes a box-shaped chamber (accommodating chamber) 11 made of a metal, e.g., aluminum or stainless steel, the chamber 11 being grounded, and a transfer arm (substrate transfer mechanism) 12 for transferring a substrate W into the chamber 11.

Disposed in a sidewall of the chamber 11 is a loading/unloading gate 13 through which the substrate W is loaded and unloaded by the transfer arm 12 into and from the chamber 11a. The loading/unloading gate 13 is sealed by a gate valve 14 that can be freely opened and closed. Further, an exhaust line (exhaust unit) 15 is connected to a bottom wall of the chamber 11. The exhaust line 15 has an exhaust pipe 16 with a diameter of, e.g., 25 mm, a valve V1 disposed in the exhaust pipe 16 and a dry pump 17 as an exhaust pump connected to the exhaust pipe 16. The exhaust line 15 exhausts to depressurize the inside of the chamber 11. The valve V1 can block the communication between the chamber 11 and the dry pump 17. Further, a gas introduction line (gas introduction unit) 18 is connected to a ceiling wall of the chamber 11. The gas introduction line 18 includes a gas supply unit 19 for supplying, e.g., an $N_2$ gas and a gas introduction pipe 20 for introducing the $N_2$ gas from the gas supply unit 19 into the chamber 11. A valve V2 is disposed in the gas introduction pipe 20. The valve V2 can block the communication between the chamber 11 and the gas supply unit 19.

Further, the substrate transfer apparatus 10 includes a cooling unit (gas temperature control unit) 6 for cooling the $N_2$ gas introduced into the chamber 11, which is connected to both the chamber 11 and the gas supply unit 19 via the gas introduction pipe 20, and a pressure control unit 7 disposed in the exhaust pipe 16 for controlling a pressure in the chamber 11. The cooling unit 6 cools the $N_2$ gas introduced into the chamber 11 based on the temperature of the chamber detected by a temperature sensor 8 to be described later, and the pressure control unit 7 controls the pressure in the chamber 11 to be kept at, e.g., 1.3 kPa (10 Torr)

The substrate transfer apparatus 10 is installed in a cluster type or parallel type substrate processing system, and is connected via the gate valve 14 to a plasma processing apparatus or the like included in the substrate processing system.

Figure 2:
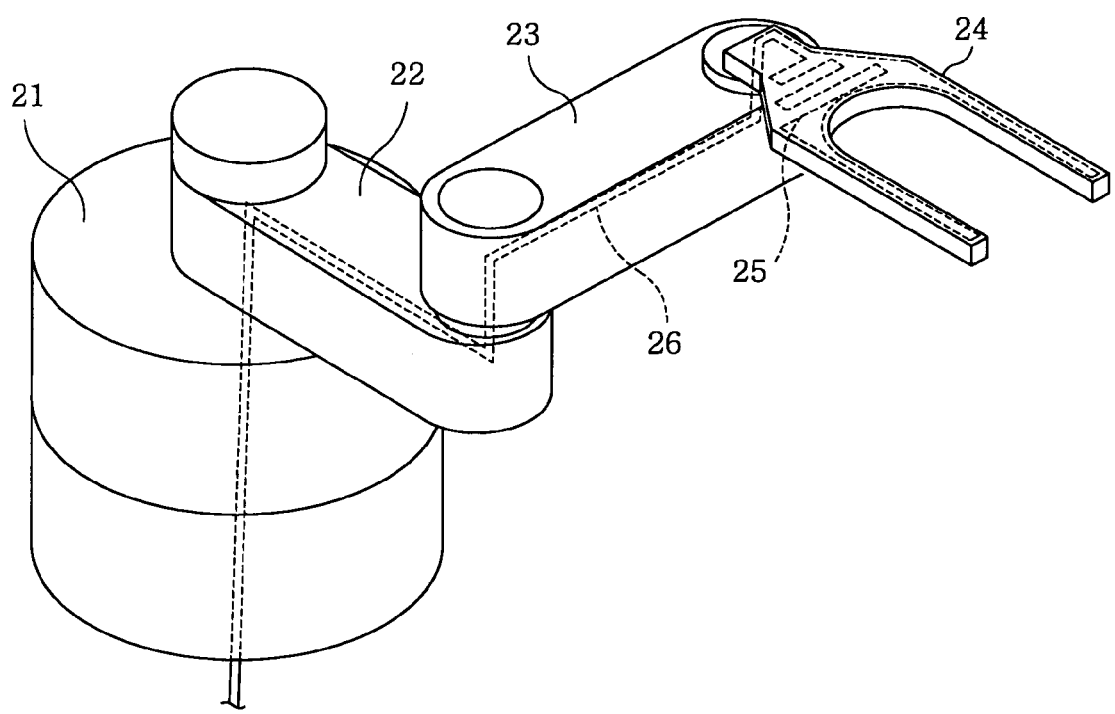
FIG. 2 depicts a perspective view schematically showing configurations of a transfer arm in FIG. 1.

FIG. 2 is a schematic view showing configurations of the transfer arm 12 in FIG. 1.

In FIG. 2, the transfer arm 12, as a scalar arm type handling device, includes a turntable 21 disposed on a bottom surface of the chamber 11 such that it can be freely rotated about an axis vertical to the bottom surface; a rod-shaped first arm member 22 whose one end is connected to the turntable 21; a rod-shaped second arm member 23 whose one end is connected to the other end of the first arm member 22 rotatable about a vertical axis thereof; and a pick (mounting table) 24 whose end is connected to the other end of the second arm member 23 rotatable about a vertical axis thereof, the substrate W being mounted on the pick 24.

In the transfer arm 12, the turntable 21, the first arm member 22, the second arm member 23 and the pick 24 cooperate to rotate so that the pick 24 and the substrate W mounted thereon can be moved to a desired position in the chamber 11 or into a plasma processing apparatus adjacent thereto via the loading/unloading gate 13.

The pick 24 has a tuning fork configuration with a pronged portion, and the substrate W is mounted on the pronged portion of the pick 24. As described above, the end part of the handle portion of the pick 24, which is the other end of the fork opposite to the pronged end thereof, is connected to the other end of the second arm member 23.

Further, the transfer arm 12 includes a temperature control unit 28 for controlling temperature of the pick 24, and the temperature control unit 28 forms temperature gradients in the pick 24 and the inner wall of the chamber 11. Specifically, the temperature control unit 28 includes a temperature sensor (detection unit) 8 for detecting temperature of the inner wall of the chamber 11, a resistance (heating unit) 25 such as a sheath heater, embedded in the pick 24 of the transfer arm 12, for heating the pick 24, and a controller 9 for controlling the temperature of the resistance 25, the controller 9 being connected to the resistance 25 via a wiring 26 disposed in the second arm member 23, the first arm member 22 and the turntable 21.

The controller 9 controls the temperature of the pick 24 by heating the resistance 25 based on the temperature of the inner wall of the chamber 11 detected by the temperature sensor 8. In this way, it is possible to form a desired temperature gradient in the pick 24 and the inner wall of the chamber 11, so that the particles attached to the substrate W can be assured to be detached and removed therefrom. Further, at this time, it is preferable that the pick 24 of the transfer arm 12 is controlled to be kept at a temperature higher by at least 30 K than that of the inner wall of the chamber 11. Therefore, the particles attached to the substrate W can be further assured to be detached and removed therefrom.

In the substrate transfer apparatus 10, the temperature of the inner wall of the chamber 11 is detected by the temperature sensor 8 and an electrical signal corresponding to the detected temperature is outputted to the controller 9. The controller 9 determines a voltage to be applied to the resistance 25 based on the signal, wherein the resistance 25 is heated by applying the determined voltage thereto and the substrate W mounted on the pick 24 is mainly heated by a heat transfer from the pick 24. In this way, a temperature gradient is formed in the pick 24 of the transfer arm 12, the substrate W mounted on the pick 24 and the inner wall of the chamber 11, so that a thermophoretic force is exerted on the particles in a direction to make them move away from the substrate W (a direction from the pick 24 toward the inner wall of the chamber 11). At this time, on the substrate W, at the interface between the substrate and each particle, a thermal stress is developed between the substrate and each particle in a direction to separate them from each other due to a difference in inherent linear expansion coefficient of the materials, so that the particles are detached from the substrate W to be lifted up. The lifted particles are moved by the thermophoretic force toward the inner wall of the chamber 11 having a lower temperature than that of the pick 24.

As described above, a particle removal mechanism, at a time when the particles are removed from the substrate W and the pick 24 of the transfer arm, can be explained as a particle detachment process wherein the particles are detached by the thermal stress and a particle movement process wherein the particles are moved by the thermophoretic force. Here, if it is assumed that an initial speed of a particle detached from the substrate W is 10 m/s and a pressure in the chamber 11 is 1.3 kPa (1.0 Torr), a speed of the particle detached from the substrate W is calculated by using a known equation for the speed as follows:

$$F_T = -\frac{6\pi d_p \mu^2 C_s (\gamma + C_t Kn)}{\rho(1 + 3C_m Kn)(1 + 2\gamma + 2C_t Kn)} \frac{1}{T} \frac{dT}{dt} \qquad \text{Eq. 1}$$

Figure 3:
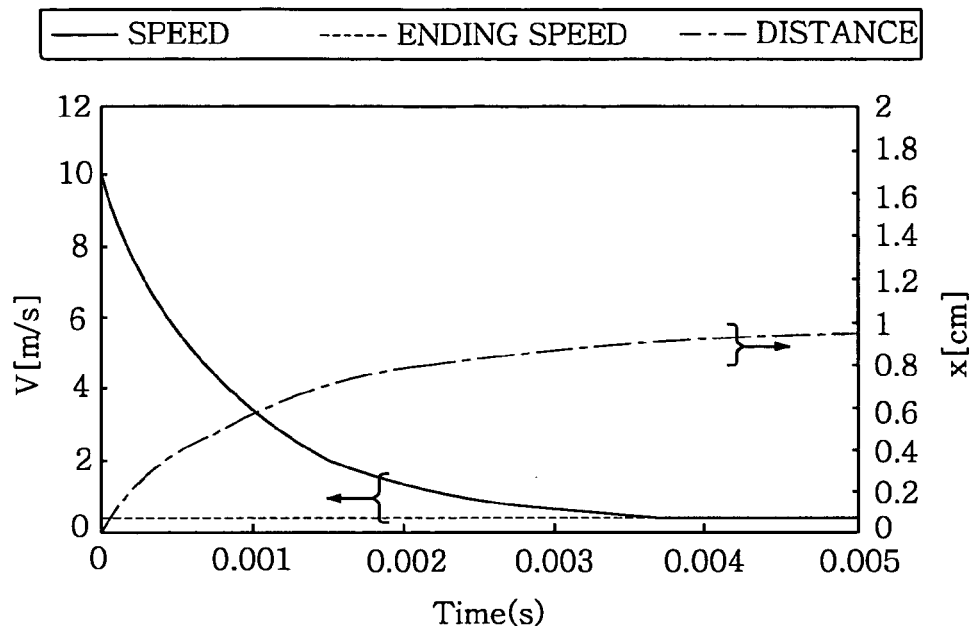
FIG. 3 sets forth a graph showing results of calculations of a speed of a particle detached from a substrate.

As a result, as shown in FIG. 3, the speed of the particle (the solid line in the drawing) reaches a thermophoretic speed in about 0.004 sec, i.e., in a few milliseconds after the particle has been detached from the substrate W. Further, when the speed of the particle has reached the thermophoretic speed, the distance of the particle from the top surface of the substrate W (the dashed dotted line in the drawing) becomes about 0.9 cm. In other words, the particle detached from the substrate W moves away to attain a speed determined mainly by the thermophoretic force at a location spaced apart about several millimeters from the substrate W and keeps moving away thereafter without staying in the vicinity of the substrate W after having separated therefrom.

Hereinafter, there will be described a relationship between a pressure and the particle movement process in the particle removal mechanism.

Figure 4:
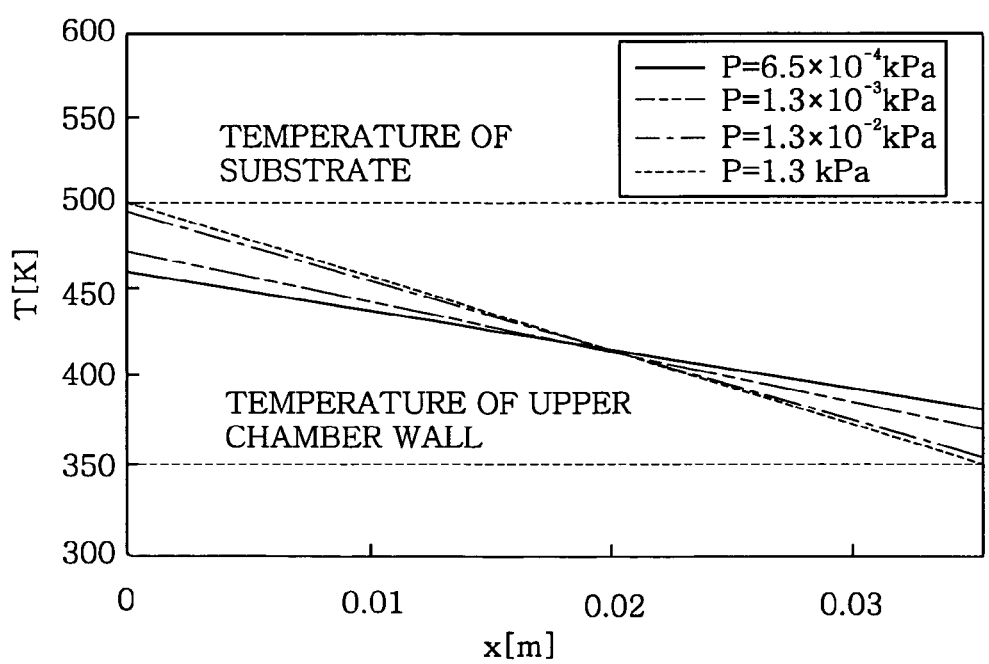
FIG. 4 presents a graph showing results of calculations of temperature gradients corresponding to respective pressure in a chamber.

In the substrate transfer apparatus in FIG. 1, while the inside of the chamber 11 is depressurized through the exhaust line 15, there occurs in the chamber 11 a temperature jump, an abrupt change in temperature, from the temperature at the inner wall of the chamber 11 to that of the atmosphere in the chamber 11. As a result, the temperature of an $N_2$ gas contacting with the inner wall of the chamber 11 becomes different from that of the inner wall of the chamber 11. FIG. 4 shows calculated temperature gradients corresponding to respective pressures in the chamber 11 in a case where the temperatures of the substrate W and the inner wall of the chamber 11 are respectively kept at 350 K and 500 K, wherein the effect of the temperature jump has been taken into consideration and the horizontal axis of FIG. 4 represents a distance between the substrate W and the inner wall of the chamber 11.

As shown in FIG. 4, as a rarity (vacuum level) in the chamber 11 is greater, i.e., Knudsen number indicating the rarity of a flow field is higher, the temperature jump, e.g., the temperature difference between the substrate W and the temperature gradient at the distance of 0.00 m, increases and even though the temperature difference between the pick 24 of the transfer arm 12 and the inner wall of the chamber 11 is same as that between the substrate W mounted on the pick 24 and the inner wall of the chamber 11, the temperature gradient decreases. As described above, since the temperature gradient is affected by the temperature jump, as the rarity in the chamber 11 becomes greater to thereby make the temperature jump higher, the thermophoretic force applied to the particles becomes smaller.

Figure 5:
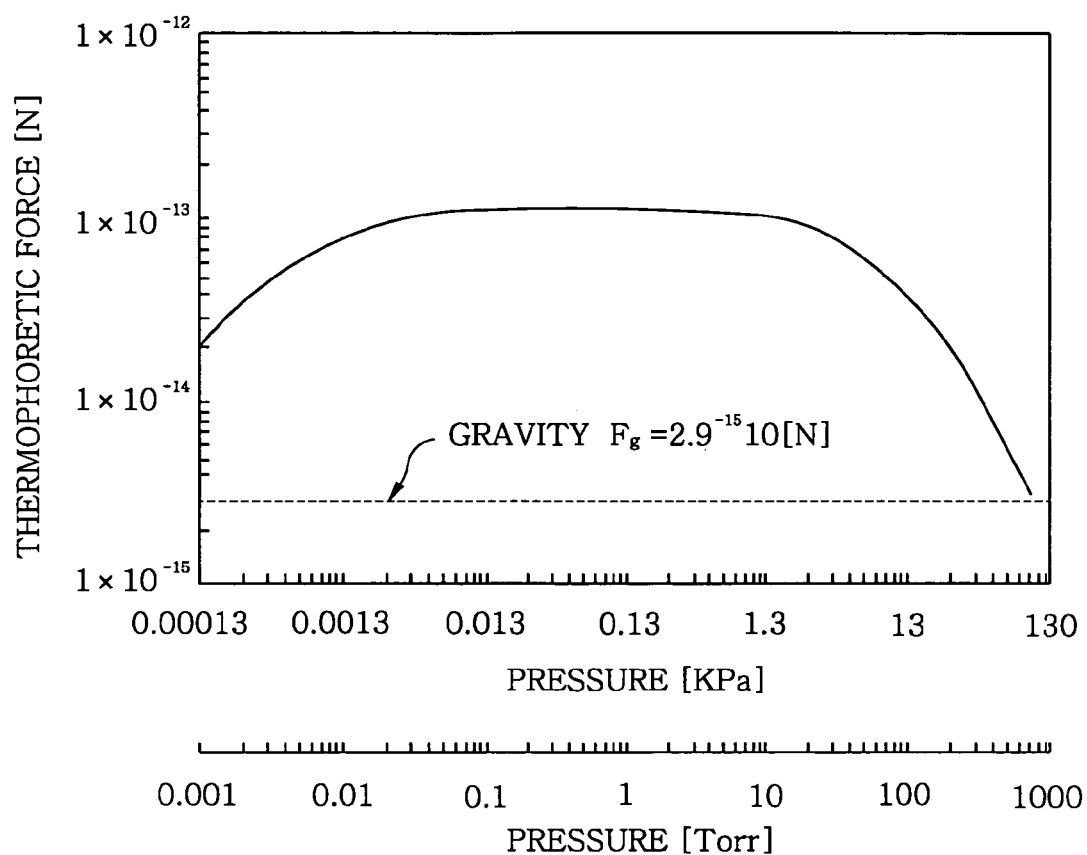
FIG. 5 describes a graph showing results of calculations of a pressure-dependency of a thermophoretic force applied to the particles.

By taking the results of FIG. 4 into consideration, a pressure dependency of the thermophoretic force applied to $SiO2$ particles of 0.6 μm in diameter is calculated under the condition that the temperatures of the substrate W and the inner wall of the chamber 11 are respectively kept at 623.15 K and 338.15 K and the distance between the substrate W and the inner wall of the chamber is 35 mm. As a result, as shown in FIG. 5, the thermophoretic force applied to the particles becomes the greatest (F=1.0×10$^{-13}$ N) under the condition that the pressure in the chamber 11 is in a range of 1.3× 10$^{-2}$~1.3 kPa (0.1~10 Torr). Accordingly, by controlling the pressure in the chamber 11 to be in a range of 0.013~1.3 kPa (0.1~10 Torr), the particles attached to the substrate W can be more effectively removed.

In accordance with this preferred embodiment, since there is formed a temperature gradient in the pick 24 on which the substrate W is mounted, the particles are detached from the substrate W due to the thermal stress produced at the interface between the substrate W and each particle, and are removed from the substrate W by the thermophoretic force applied thereto in a direction moving away from the substrate W. In this way, the particles attached to the substrate W can be detached and removed therefrom. Further, when the substrate W is transferred to a plasma processing apparatus or the like adjacent to the substrate transfer apparatus 10, the particles attached to the substrate W can be detached and removed therefrom by the pick 24. Accordingly, even when the substrate W is successively processed, it is possible to transfer the substrate W which would not affect the next process adversely. Moreover, since the detachment and removal of the particles is executed during the transfer of the substrate W, it can be performed without deteriorating the operation efficiency of the substrate processing system including the substrate transfer apparatus 10.

Furthermore, in accordance with this preferred embodiment, since the cooling unit 6 cools the N$_2$ gas introduced into the chamber 11 based on the temperature of the inner wall of the chamber 11 detected by the temperature sensor 8, even if the pick 24 cannot be heated up to a desired temperature by controlling the resistance 25, it is possible to form a temperature gradient in the vicinity of the pick 24.

Figure 6:
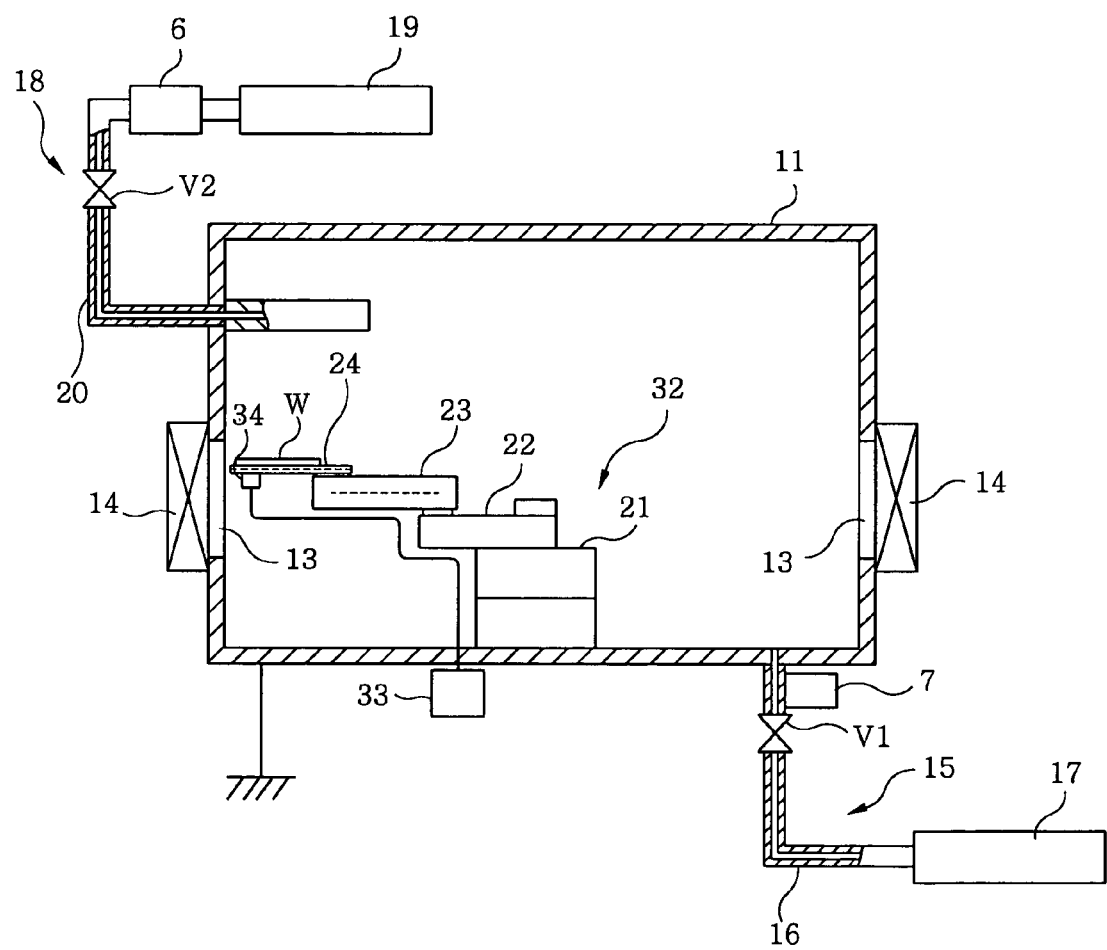
FIG. 6 provides a schematic view showing a substrate transfer apparatus in accordance with a second preferred embodiment of the present invention.

FIG. 6 is a schematic view showing configurations of a substrate transfer apparatus in accordance with a second preferred embodiment of the present invention.

Since the substrate transfer apparatus in FIG. 6 has basic configurations same as those in FIG. 1, like references are applied to like components and descriptions thereon will be omitted in order to avoid redundancy. Hereinafter, there will be described only components different from those in FIG. 1.

In FIG. 6, the substrate transfer apparatus 30 includes a transfer arm 32 for transferring a substrate W into the chamber 11. The transfer arm 32 has a turntable 21 disposed on a bottom surface of the chamber 11, the turntable 21 being rotatable about an axis vertical to the bottom surface; a rod-shaped first arm member 22 whose one end is connected to the turntable 21; a rod-shaped second arm member 23 connected to the first arm member 22; and a pick 24 connected to the other end of the second arm member 23, the substrate W being mounted on the pick 24.

Further, the transfer arm 32 includes a vibrator 33 for generating ultrasonic vibrations, e.g., vibrations with a frequency of 40 kHz, and an oscillator 34 connected to the vibrator 33 and secured to the pick 24. The vibrator 33 generates the ultrasonic vibrations in a direction perpendicular to the main surface of the substrate W mounted on the pick 24. Although the vibrator 33 is disposed in the direction perpendicular to the main surface of the substrate W, it may be disposed in an arbitrary direction, e.g., in a direction parallel to the main surface of the substrate W.

The vibrator 33 generates the ultrasonic vibrations and transfers them to the oscillator 34 to vibrate the pick 24 of the transfer arm 32. The vibrations of the pick 24 are transferred to the substrate W mounted thereon, so that the substrate W vibrates at an ultrasonic frequency. In this way, the bonding strength between the substrate W and the particles becomes weak, so that the particles can be detached and removed from the substrate W.

In accordance with the second preferred embodiment, since the ultrasonic vibrations are applied to the pick 24 and hence the substrate W mounted thereon, the bonding strength between the substrate W and the particles becomes weak, so that the particles can be detached and removed from the substrate W.

Figure 7:
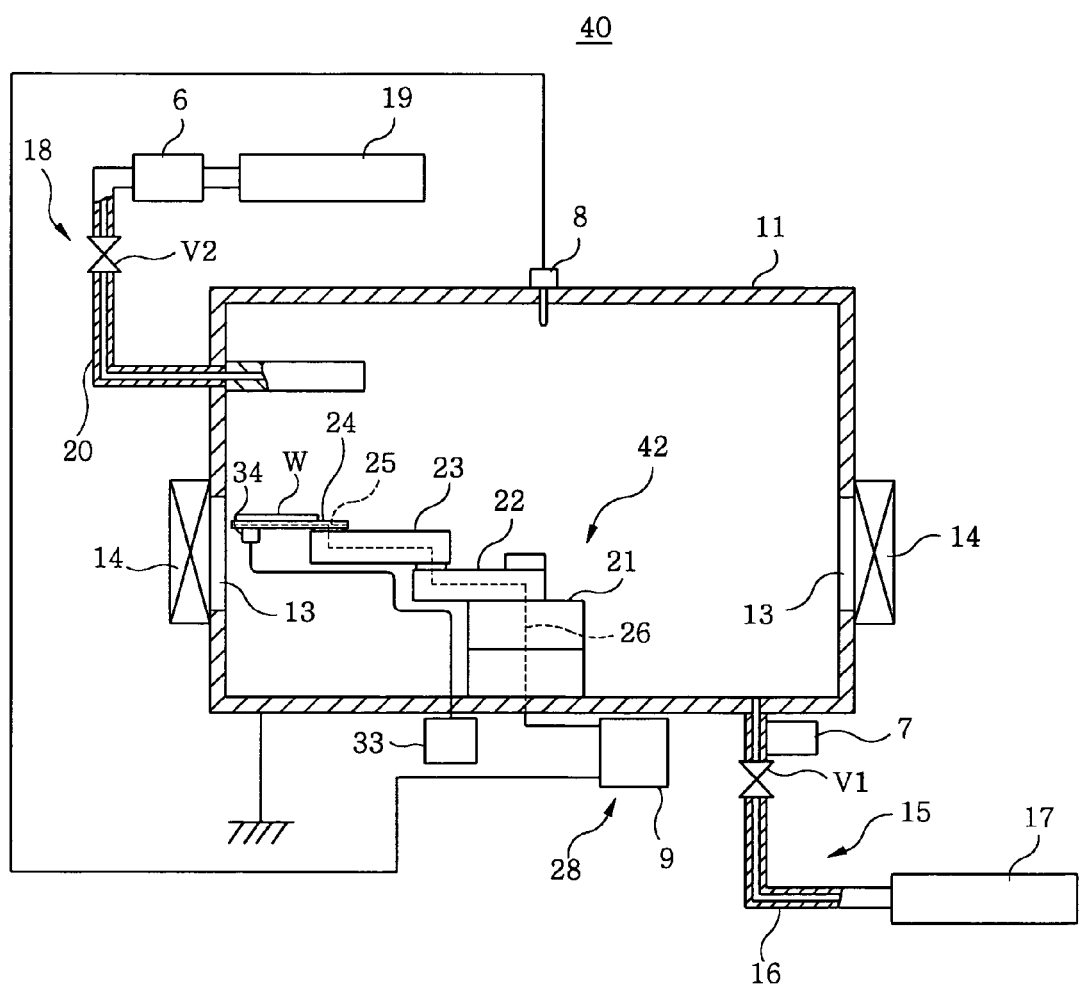
FIG. 7 represents a schematic view showing a substrate transfer apparatus in accordance with a third preferred embodiment of the present invention.

FIG. 7 is a schematic view showing configurations of a substrate transfer apparatus in accordance with a third preferred embodiment of the present invention.

Since the substrate transfer apparatus in FIG. 7 has basic configurations same as those in FIG. 1, like references are applied to like components and descriptions thereon will be omitted in order to avoid redundancy. Hereinafter, there will be described only components different from those in FIG. 1.

In FIG. 7, the substrate transfer apparatus 40 includes a transfer arm 42 for transferring the substrate W into a chamber 11. The transfer arm 42 includes a turntable 21 disposed on the bottom surface of the chamber 11 such that it can be freely rotated about an axis vertical to the bottom surface; a rod-shaped first arm member 22 connected to the rotation table 21; a rod-shaped second arm member 23 whose one end is connected to the first arm member 22; a pick 24 connected to the other end of the second arm member 23; a temperature control unit 28 for controlling temperature of the pick 24; a vibrator 33 for generating ultrasonic vibrations, e.g., vibrations with a frequency of 40 kHz; and an oscillator 34 connected to the vibrator 33 and secured to the pick 24.

The temperature control unit 28 forms a temperature gradient in the pick 24 and the inner wall of the chamber 11. Specifically, the temperature control unit 28 includes a temperature sensor 8 for detecting temperature of the inner wall of the chamber 11, a resistance 25 such as a sheath heater, embedded in the pick 24 of the transfer arm 42, for heating the pick 24, and a controller 9 for controlling the temperature of the resistance 25, the controller 9 being connected to the resistance 25 through a wire 26 extended in the second arm member 23, the first arm member 22 and the rotation table 21.

In accordance with the third preferred embodiment, a desired temperature gradient is formed in the pick 24 on which the substrate W is mounted and the ultrasonic vibrations are applied to the pick 24 as well. As a result, the particles are detached from the substrate W due to the thermal stress at the interface between the substrate W and each particle, so that the particles can be removed from the substrate by the thermophoretic force applied thereto in a direction moving away from the substrate W. Further, it is possible to make the bonding strength between the substrate W and the particles weak by applying the ultrasonic vibrations to the substrate W, so that the particles attached to the substrate W can be further assured to be detached and removed therefrom.

In the aforementioned embodiments, although the N$_2$ gas is introduced into the chamber 11, the present invention is not limited thereto. For example, an inert gas such as helium (He), neon (Ne), argon (Ar), krypton (Kr), xenon (Xe) or radon (Rn) may be introduced into the chamber 11, and O$_2$ gas or the like may be used.

In the aforementioned embodiments, although the pick 24 is heated by the resistance 25 such as the sheath heater, the present invention is not limited thereto. For example, the pick 24 may be heated by using, e.g., an infrared ray lamp.

In the aforementioned embodiments, although the vibrator 33 generates the vibrations with the frequency of 40 kHz, the present invention is not limited thereto. For example, the vibrator 33 may generate vibrations with a frequency of 16000 Hz~10 MHz. Preferably, the vibrator 33 may generate vibrations with a frequency of 16000 Hz~40 kHz.

In the aforementioned embodiments, the scalar arm type handling device is used as the transfer arms 12, 32 and 42. However, the type of the transfer arm is not limited thereto and a frog-leg type handling device may be used.

In the aforementioned embodiments, although the transfer arms 12, 32 and 42 detach and remove the particles from the substrate W, the present invention is not limited thereto. For example, the above processing may be performed during a transfer of a substrate that is not contaminated by particles or during an idling operation of the substrate transfer apparatuses 10, 30 and 40, thereby preventing the substrate W from being contaminated.

In the aforementioned embodiments, as described above, the particles can be detached from the substrate W due to the thermal stress generated by the difference in inherent linear expansion coefficient of the materials. Accordingly, in case a material of particles that may be produced in the chamber 11 can be known in advance, it is preferable to coat the inner wall of the chamber 11 and the in-chamber parts such as the transfer arms 12, 32 and 42 with a material having a linear expansion coefficient different from that of the particles expected to be produced. Specifically, the transfer arms 12, 32 and 42 preferably have a surface layer formed of a specific material having a linear expansion coefficient different from that of the particles produced in the vicinity thereof. In this way, there is generated a great thermal stress at the interface between each particle and the inner wall of the chamber 11 and the in-chamber parts such as transfer arms 12, 32 and 42, so that the particles attached to the in-chamber parts can be further assured to be detached and removed therefrom.

Figure 8:
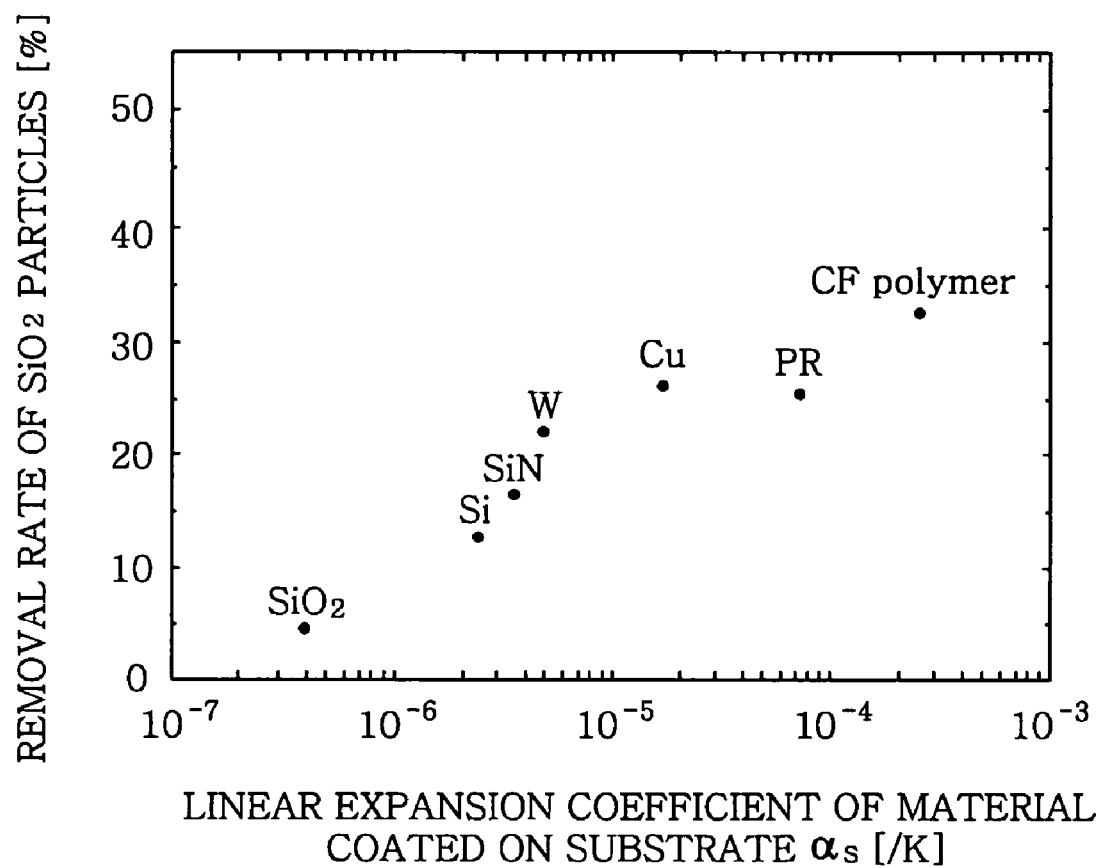
FIG. 8 sets forth a graph showing results of measurements of removal rates of $SiO_2$ particles scattered on a substrate W.

In order to confirm the above effects, the substrates were respectively coated with $SiO_2$, Si, SiN, W, Cu, PR and CF-based polymers on which $SiO_2$ particles were distributed, and there were measured removal rates of the $SiO_2$ particles on the respective substrates when they have been heated. As a result, as shown in FIG. 8, the removal rates of the $SiO_2$ particles on the substrates W coated with the CF-based polymer such as Teflon (registered trade mark) are found to be greater than that on the substrate W coated with $SiO_2$. Accordingly, in case the production of Si or $SiO_2$ particles is expected, it is preferable to coat the in-chamber parts with the CF-based polymer such as Teflon. Further, in case the production of the CF-based polymer particles is expected, it is preferable to coat the in-chamber parts with $SiO_2$. In this way, it is possible to increase the removal rate of the particles attached to the in-chamber parts. In addition, by coating the surface of the substrate W with a material having a linear expansion coefficient different from that of the particles expected to be produced, a similar improvement in the removal rate can be realized.

Figure 9:
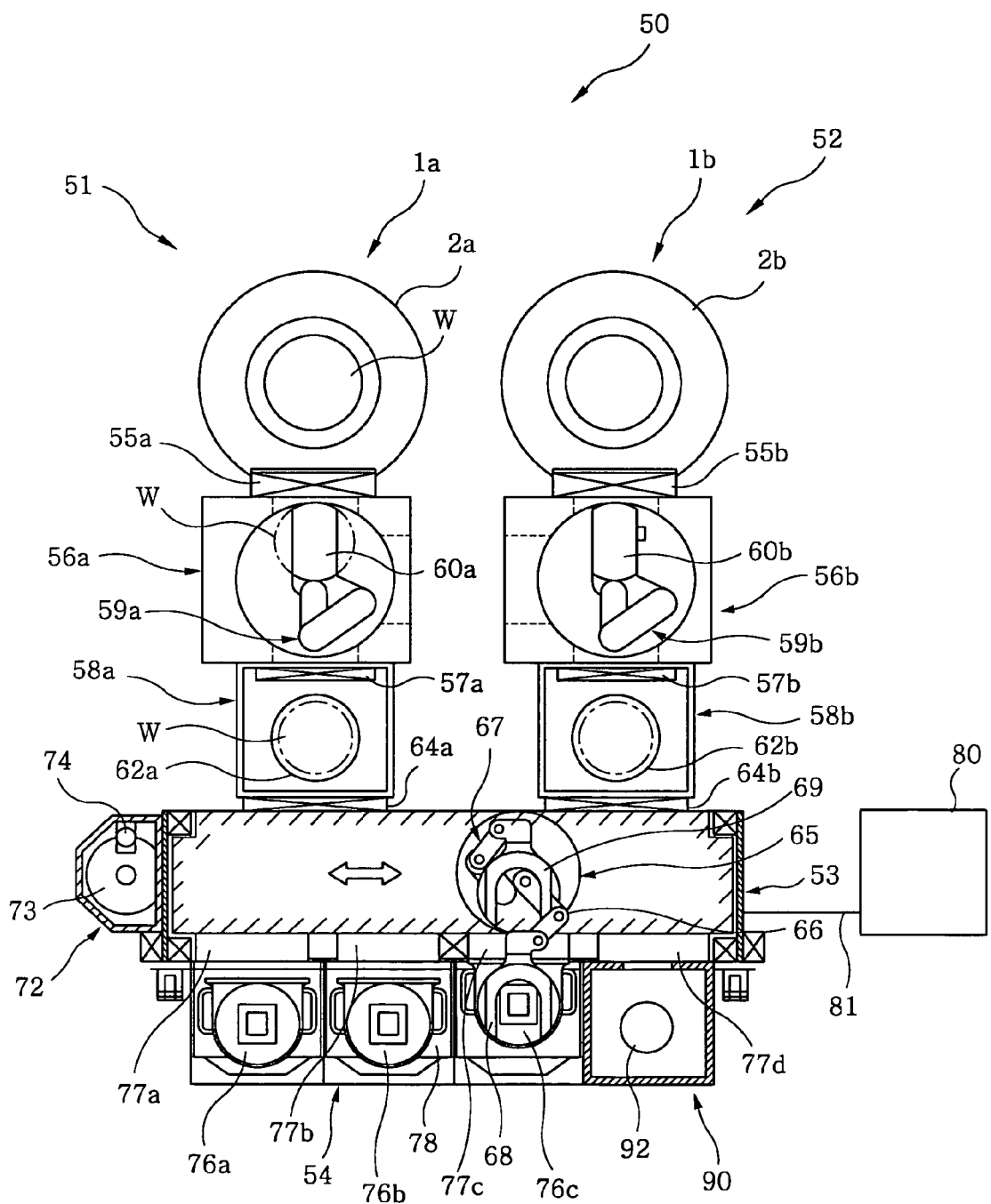
FIG. 9 depicts a schematic view showing configurations of a substrate transfer apparatus in accordance with a fourth preferred embodiment of the present invention.

FIG. 9 is a schematic view showing configurations of a substrate processing apparatus including a substrate transfer apparatus in accordance with a fourth preferred embodiment of the present invention.

In FIG. 9, a plasma processing system 50 as the substrate processing apparatus includes a first and a second processing unit 51 and 52 for performing an etching process on the substrate W, a substrate loading/unloading stage 53, and a control unit 80 for controlling the operation of the plasma processing system 50.

The first processing unit 51 includes a plasma processing apparatus 1a having a processing chamber 2a wherein the etching process is performed on the wafer W, a transfer chamber 56a, connected to the processing chamber 2a of the plasma processing apparatus 1a via a gate valve 55a which can be airtightly opened and closed, for loading and unloading the wafer W into and from the processing chamber 2a, and a load-lock chamber 58a, connected to the transfer chamber 56a via a gate valve 57a which can be airtightly opened and closed, for loading and unloading the wafer W into and from the transfer chamber 56a. Furthermore, since the second processing unit 52 has the same configurations as those of the first processing unit 51, components of the former corresponding to those of the latter are presented by like reference numerals and descriptions thereon will be omitted.

The transfer chamber 56a is constructed such that the particles and the like can be purged and evacuated to vacuum. In the transfer chamber 56a, there is provided a transfer arm 59a, e.g., as a scalar arm type handling device with a multi-joint structure capable of being extended, retracted and rotated, for carrying out loading/unloading of the substrate W between the processing chamber 2a, the load-lock chamber 58 and the transfer arm 56a. Further, at the leading end of the transfer arm 59a, there is provided a mounting table 60a on which the substrate W can be mounted.

The load-lock chamber 56a is also constructed such that the substances remaining therein can be purged and exhausted to vacuum. In the load-lock chamber 56a, there is provided a receiving table 62a on which the substrate W can be mounted. At the receiving table 62a, a cooling jacket or a heating lamp may be installed to cool the processed substrate or pre-heat the substrate to be processed as desired. In addition, the receiving table 62a itself may be constructed to have a plurality of stages capable of mounting thereon plural substrates W, respectively.

The substrate loading/unloading stage 53 has an approximately rectangular box shape and a side surface thereof is connected to the load-lock chambers 58a and 58b of the first and the second processing unit 51 and 52 via the gate valves 64a and 64b, respectively. Further, at one end of the substrate lading/unloading stage 53, there is provided a position alignment chamber 72 having therein a rotation table 73 and an optical sensor 74 for optically detecting periphery of the substrate W. In the position alignment chamber 72, an orientation flat, a notch or the like of the substrate W is detected by the optical sensor 74 and the substrate W is rotated by the rotation table 73 to carry out a position alignment thereof.

Furthermore, in the substrate loading/unloading stage 53, a transfer arm 65 is disposed to be movable along a guide rail (not shown) extended in a longitudinal direction thereof. The transfer arm 65 includes, for example, multi-joint forks 66, 67 which are independently actuated, and each of the multi-joint forks 66, 67 is constructed to be extensible, retractable and rotatable. In addition, the transfer arm 65 has arms 68 and 69, each of which is capable of grasping the substrate W, at the leading ends of the multi-joint forks 66 and 67, respectively.

The transfer arm 65 is able to transfer the substrate W accommodated in any of hoops 76a to 76c as a substrate cassette mounted in a hoop table 54 to be described later onto the rotation table 73 in the position alignment chamber 72 and the receiving table 62a or 62b in the load-lock chamber 58a or 58b. Further, it is also able to transfer the substrate W mounted on the receiving table 62a or 62b onto the rotation table 73 and into any of the hoops 76a to 76c. Each of the hoops 76a to 76c has 25 slots therein, so that 25 substrates W can be accommodated therein. In addition, the transfer arm 65 can transfer the substrate W mounted on the receiving table 62a in the load-lock chamber 58a in the first processing unit 51 to a substrate storing chamber 90 to be described later and can also transfer the substrate W stored in the substrate storing chamber 90 onto the receiving table 62b of the load-lock chamber 58b in the second processing unit 51.

Furthermore, the substrate loading/unloading stage 53 has, at the opposite side surface to the side surface connected to the load-lock chamber 58a and the load-lock chamber 58b, four ports 77a to 77d which are openings that can be freely opened and closed. Further, the substrate loading/unloading stage 53 has three hoop tables 54 corresponding to the respective ports 77a to 77c and the substrate storage chamber 90 corresponding to the port 77d. The hoop tables 54 are flat tables protruding from the side surface of the substrate loading/unloading stage 53, and the substrate storage chamber 90 serves as the substrate transfer apparatus in which the substrate W subjected to an etching process is temporarily stored. Each hoop tables 54 is provided with a mounting surface 78, on which one of the hoops 76a to 76c is mounted, and a hoop opener (not shown) for opening and closing a lid of the corresponding hoop mounted on the mounting surface 78.

Figure 10:
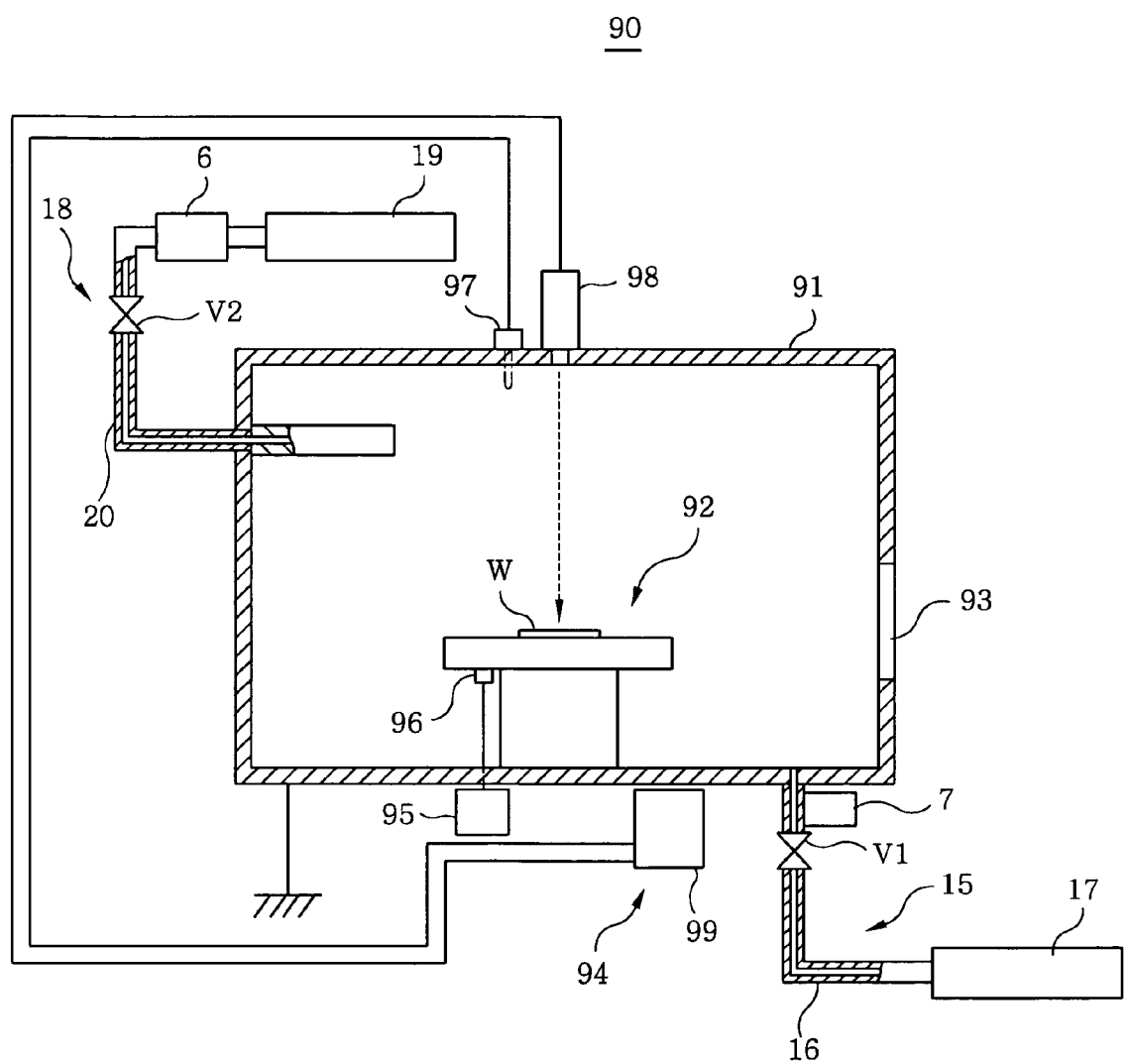
FIG. 10 is a schematic view showing configurations of a substrate storage chamber.

FIG. 10 is a schematic view showing configurations of the substrate storage chamber 90. Since the substrate storage chamber 90 has basic configurations same as those in FIG. 1, like references are presented to like components and redundant descriptions will be omitted. Hereinafter, there will be described only components thereof different from those in FIG. 1.

In FIG. 10, the substrate storage chamber 90 is constructed to carry out a particle purge or exhaust to vacuum, and includes a box-shaped grounded chamber (accommodating chamber) 91 made of aluminum or stainless steel; a mounting table (mounting unit) 92 on which the substrate W is mounted; a loading/unloading port 93 in the side wall thereof which is connected to the port 77, the substrate W being loaded and unloaded through the loading/unloading port 93 into the substrate storage chamber 90 by using the transfer arm 65; a temperature control unit 94 for controlling temperature of the mounting table 92; a vibrator 95 for generating ultrasonic vibrations, e.g., vibrations with a frequency of 40 kHz, and an oscillator 96 connected to the vibrator 95 and secured to the mounting table 92. The loading/unloading port 93 is sealed by the closable port 77.

The temperature control unit 94 includes a temperature sensor 97 for detecting temperature of the inner wall of the chamber 91; a lamp 98, disposed at an upper portion of the chamber 91, for heating the substrate W mounted on the mounting table 92 by emitting an infrared ray thereto; and a control unit 99, electrically connected to the lamp 98, for controlling the operation of the lamp 98. The light beam emitted from the lamp 98 is not limited to the infrared ray and may be any light beam capable of heating the substrate W. Further, it is preferable to be a light beam with a wavelength that does not affect a resist film formed on the substrate W.

The control unit 99 controls the temperature of the substrate W by controlling the amount of the infrared ray emitted from the lamp 98 based on the temperature of the inner wall of the chamber 91 detected by the temperature sensor 97. Further, in case no substrate W is mounted on the mounting table 92, the control unit 99 controls the temperature of the mounting table 92 by controlling the amount of the infrared ray emitted from the lamp 98 based on the temperature of the inner wall of the chamber 91 detected by the temperature sensor 97. In this way, there are formed temperature gradients between the substrate W and the inner wall of the chamber 91 and between the mounting table 92 and the inner wall of the chamber 91. Further, preferably, the mounting table 92 is controlled to be at a temperature higher by at least 30 K than that of the inner wall of the chamber 91.

In the plasma processing system 50 constructed as described above, when substrates W in the hoops 76a to 76c are processed, the lids of the hoops 76a to 76c are opened by the hoop opener and one or more of the ports 77a to 77c corresponding to the hoop table 54 mounting therein the hoops 76a to 76c are opened. Then, the substrate W accommodated in one of the hoops 76a to 76c is transferred by the transfer arm 65 and is loaded in the processing chamber 2a of the plasma processing apparatus 1a via the position alignment chamber 72, and the load-lock chamber 58a and the transfer chamber 56a in the first processing unit 51. Further, the substrate W, on which a desired process has been performed in the processing chamber 2a, is transferred to the substrate storage chamber 90 via the transfer chamber 56a and the load-lock chamber 58a of the first processing unit 51.

The substrate W loaded in the substrate storage chamber 90 is mounted on the mounting table 92 by the transfer arm 65 and heated by the infrared ray emitted from the lamp 98 based on the temperature of the inner wall of the chamber 91 detected by the temperature sensor 97. In this way, desired temperature gradients are formed in the mounting table 92 and the inner wall of the chamber 91, and in the substrate W and the inner wall of the chamber 91. Further, ultrasonic vibrations are applied to the substrate W by the vibrator 95. Thereafter, there is carried out the purge and vacuum exhaust for the particles in the chamber 91.

After the purge and the vacuum exhaust for the particles in the chamber 91, the substrate W which has been heated and vibrated in the substrate storage chamber 90 is loaded into the processing chamber 2b of the plasma processing apparatus 1b via the load-lock chamber 58b and the transfer chamber 56b in the second processing unit 52, and a desired process is performed on the substrate W in the processing chamber 2b.

In accordance with this preferred embodiment, the amount of the infrared ray emitted from the lamp 98 based on the temperature of the inner wall detected by the temperature sensor 97 is controlled and a temperature gradient is formed in the substrate W and the mounting table 92 heated by the light beam. Accordingly, between plural processes performed on the substrate W by the first processing unit 51 and the second processing unit 52, in a case where the substrate W is transferred into the chamber 91, particles can be detached from the substrate W due to the thermal stress generated at the interface between the substrate W and the particles and can be then removed from the substrate W by the thermophoretic force applied thereto in a direction moving away from the substrate W. As a result, the particles attached to the substrate W can be assured to be detached and removed therefrom.

In this preferred embodiment, although the substrate storage chamber 90 is provided independently, at least one of the load-lock chambers 58a and 58b may serve as the substrate storage chamber. In this case, the load-lock chamber 58a and/or 58b serving as the substrate storage chamber has the same configurations as those of the substrate storage chamber 90.

Figure 11:
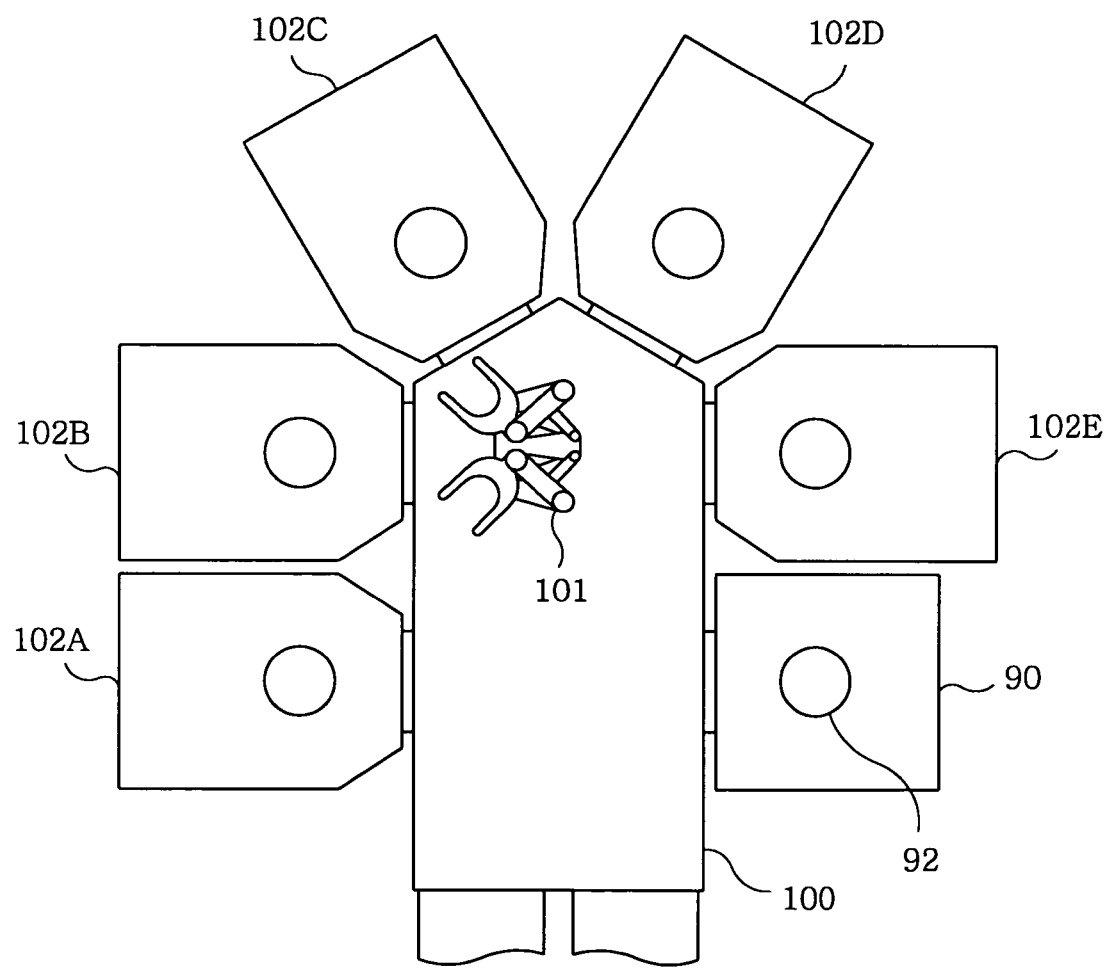
FIG. 11 describes a schematic view showing a modification of the plasma processing system including the substrate storage chamber.

Further, in this preferred embodiment, although the plasma processing system 50 includes the first and the second processing unit 51 and 52 for performing an etching process on the substrate W and the substrate loading/unloading stage 53 having at one side surface thereof the substrate storage chamber 90, the present invention is not limited thereto. As shown in FIG. 11, the plasma processing system 50 may include a transfer module 100, connected to a plurality of processing chambers to be described later via respective gate valves (not shown) which can be airtightly opened and closed, for loading and unloading the substrate W into and from the processing chambers; a double arm type transfer arm unit 101 disposed in the transfer module 100, the transfer arm unit 101 being formed of two scalar type transfer arms; five processing chambers 102A to 102E disposed radially around the transfer module 100; and the substrate storage chamber 90 as a substrate transfer chamber connected to the transfer module 100 via a gate valve (not shown) which can be airtightly opened and closed, the substrate W, which has been subject to the etching process in the processing chambers 102A to 102E, being temporarily stored in the substrate storage chamber 90.

In the plasma processing system shown in FIG. 11, a substrate W to be processed is loaded in the transfer module 100 by the transfer arm unit 101 and is then loaded into, e.g., the processing chamber 102A of the processing chambers 102A to 102 E via the corresponding gate valve (not shown). Further, the substrate W, after being subjected to a desired process in the processing chamber 102A, is transferred by the transfer arm unit 101 into the substrate storage chamber 90 via the transfer module 100.

The substrate W loaded in the substrate storage chamber 90 is mounted on the mounting table 92 by the transfer arm unit 101 and heated by the infrared ray emitted from the lamp 98 based on the temperature of the chamber 91 detected by the temperature sensor 97. As a result, there is formed a desired temperature gradient in the substrate W and the inner wall of the chamber 91, and there is formed a desired temperature gradient in the mounting table 92 and the inner wall of the chamber 91 as well. Further, the ultrasonic vibrations generated by the vibrator 95 are applied to the substrate W. Thereafter, the purge and vacuum exhaust for the particles in the chamber 91 is performed.

After the purge and vacuum exhaust for the particles in chamber 91 has been performed, the substrate W, which has been heated and vibrated in the substrate storage chamber 90, is loaded by the transfer arm unit 101 into, e.g., the processing chamber 102B via the transfer module 100. A predetermined process is then performed on the substrate W in the processing chamber 102B.

The timing of loading the substrate W into the substrate storage chamber 90 is not limited to the time when the substrate W is transferred from the processing chamber 102A to the processing chamber 102B. The substrate W may be loaded into the substrate W at a time while, between two of the processing chambers 102A to 102B, the substrate W is being transferred from one processing chamber to the other, and at a time after plural processes have been completed in two or more of the processing chambers 102A to 102E.

In this preferred embodiment, although the temperature control apparatus 94 includes the lamp 98 disposed at the upper portion of the chamber 91 and heating the substrate W by emitting, e.g., the infrared ray to the substrate W mounted on the mounting table 92, the present invention is not limited thereto. For example, the temperature control apparatus 94 may include a resistance, e.g., a sheath heater, which is embedded in the mounting table 92 and heats the mounting table 92 and hence the substrate W. In this way, the temperature of the mounting table 92 is controlled and a temperature gradient is formed in the mounting table 92, so that the particles are detached from the substrate W due to a thermal stress generated at the interface between the substrate W mounted on the mounting table 92 and each particle. As a result, the particles can be removed from the substrate W by a thermophoretic force applied thereto in the direction moving away from the substrate W. Accordingly, the particles attached to the substrate W can be assured to be detached and removed therefrom.

In this preferred embodiment, in case the material of particles that may be produced in the chamber 91 can be known in advance, as similarly to the first preferred embodiment, it is preferable that the inner wall of the chamber 91 and the in-chamber parts such as the mounting table 91 are coated with a material having a linear expansion coefficient greatly different from that of the particles expected to be possibly produced. By dosing so, a great thermal stress can be generated at the interface between the inner wall of the chamber 91 and each particle and at the interface between the in-chamber parts such as the mounting table 92 and each particle, so that the particles attached to the in-chamber parts can be assured to be detached and removed therefrom.

Moreover, the object of the present invention can also be achieved by supplying a storage medium that stores a software program for executing the functions of the aforementioned preferred embodiments to the system or apparatus and by executing the program stored in the storage medium through a computer (or CPU, MPU etc.) of the system.

In this case, the program stored in the storage medium itself performs the inventive functions of the present invention, so that the program and the storage medium storing it are both included in the present invention.

As the storage medium that stores the program, a floppy disk, a hard disk, an optical disk, a magneto-optical disk, a CD-ROM, a CD-R, a CD-RW, a DVD-ROM, a DVD-RAM, a DVD-RW, a DVD+RW, a magnetic tape, a nonvolatile memory card, a ROM and the like may be used. Alternatively, the program may be supplied by being downloaded from another computer (not shown) and a database connected to the internet, a commercial network, a local area network or the like.

Further, the present invention includes a case where an operation system operated in a computer executes a part or all of the actual processing based on instructions of the program as well as a case where the functions of the aforementioned preferred embodiments are achieved by a computer executing the program.

Furthermore, the present invention includes a case where, after the program stored in the storage medium has been recorded in a memory provided in a function extension board installed in a computer or a function extension unit connected to the computer, a CPU and the like provided in the function extension board or unit executes a part or all of the actual processing based on instructions of the program, thereby achieving the functions of the aforementioned preferred embodiments.

Hereinafter, experimental examples of the present invention will be described in detail. In the following examples, simulative experiments were performed by using processing chambers of the processing apparatuses as the substrate transfer apparatuses 10 and 30, respectively.

First, in the processing chamber as the substrate transfer apparatus 10, after preparing a Si wafer whose surface had $SiO_2$ particles with a diameter of 0.6 μm attached thereto in advance, the Si wafer was mounted on a lower electrode as the transfer arm in the processing chamber. Thereafter, the temperature of the lower electrode was increased while the pressure in the processing chamber was controlled to 0.13 kPa (1.0 Torr), and the number of $SiO_2$ particles (number/minute) detached from the Si wafer during the increase in temperature was measured. Further, the temperature difference between an upper electrode and the Si wafer was obtained as the temperature difference between the inner wall of the substrate transfer apparatus 10 and the Si wafer.

Figure 12:
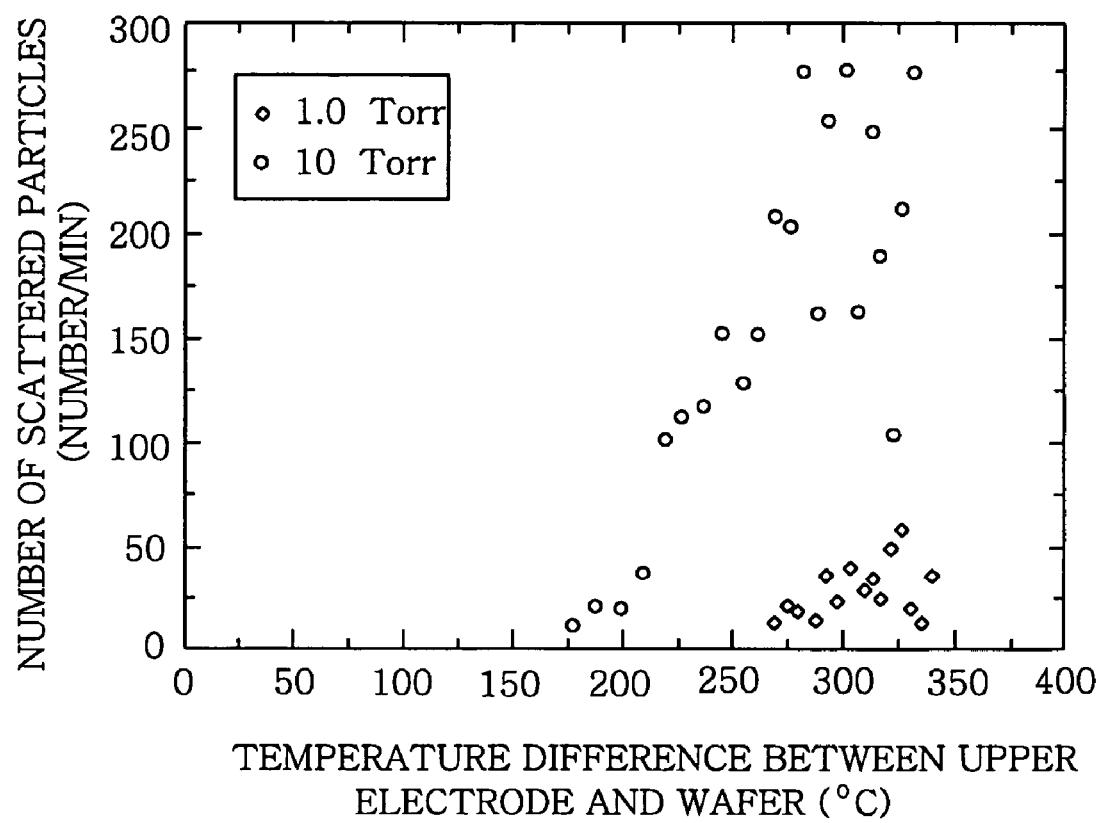
FIG. 12 provides a graph showing relationships of a temperature difference between an upper electrode in a processing chamber and a Si wafer and a decrement of $SiO_2$ particles on the Si wafer, in a removal process of particles performed as an experimental example of the present invention.

Similarly, the temperature of the lower electrode was increased while the pressure in the processing chamber was controlled to be maintained at 1.3 kPa (10 Torr), and the number of $SiO_2$ particles (number/minute) detached from the Si wafer during the increase in temperature was measured. The results are illustrated in FIG. 12.

By doing so, it was appreciated that the number of SiO$_2$ particles (number/minute) detached from the Si wafer was sharply increased when the temperature difference between the upper electrode and the Si wafer was 150° C. or greater. That is, from FIG. 12, by the effect of thermophoretic force in terms of the pressure in the processing chamber, it was observed that the amount of the SiO$_2$ particles detached from the Si wafer depended on the pressure.

Figure 13:
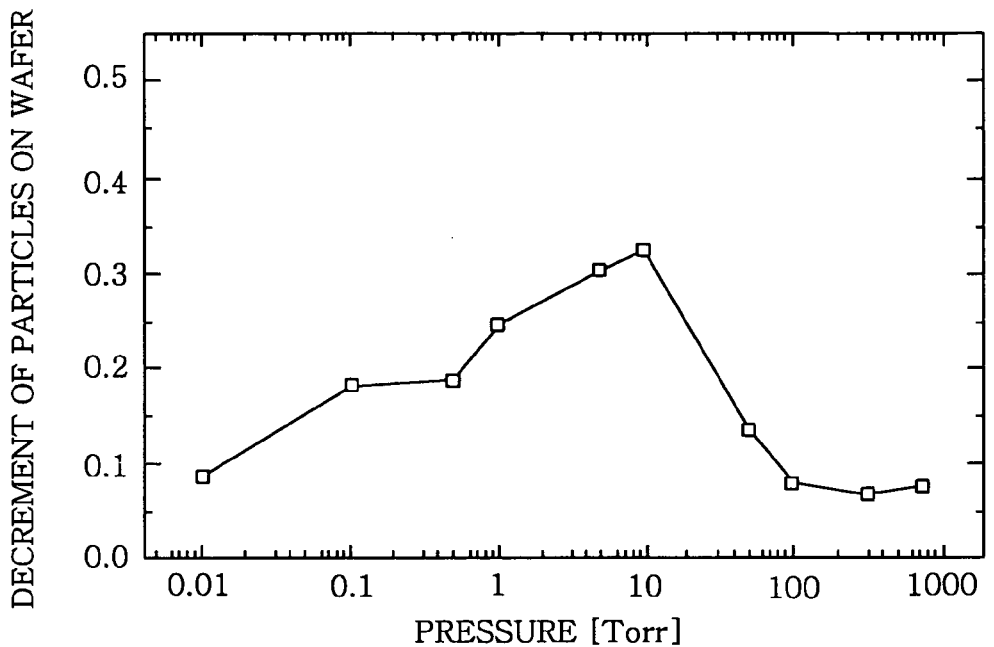
FIG. 13 represents a graph showing relationships between a pressure in the processing chamber and a decrement of $SiO_2$ particles on the Si wafer, in the removal process of particles performed as an experimental example of the present invention.

Subsequently, in the processing chamber, after preparing a Si wafer whose surface had SiO$_2$ particles with a diameter of 0.6 μm attached thereto in advance, the Si wafer was mounted on the lower electrode. Thereafter, the lower electrode was heated up to a predetermined temperature, and the Si wafer was mounted for a predetermined time period while the pressure in the processing chamber was controlled to be at 0.0013 kPa (0.01 Torr). The number of SiO$_2$ particles detached from the Si wafer for the predetermined time period was measured, and a decrement of the SiO$_2$ particles on the Si wafer was obtained from the measurement results. Further, while the pressure in the processing chamber was changed from 0.0013 kPa (0.01 Torr) to 130 kPa (1000 Torr), the same measurement was carried out. The results thereof are illustrated in FIG. 13.

In this way, it was appreciated that a number of the SiO$_2$ particles could be detached from the Si wafer when controlling the pressure in the processing chamber to be 0.013~13 kPa (0.1~100 Torr), preferably 0.13~1.3 kPa (1.0~10 Torr). That is, it was understood that, with the thermophretic force in the vicinity of the Si wafer depending on the pressure in the processing chamber, the SiO$_2$ particles attached to the Si wafer could be further assured to be detached therefrom.

Figure 14:
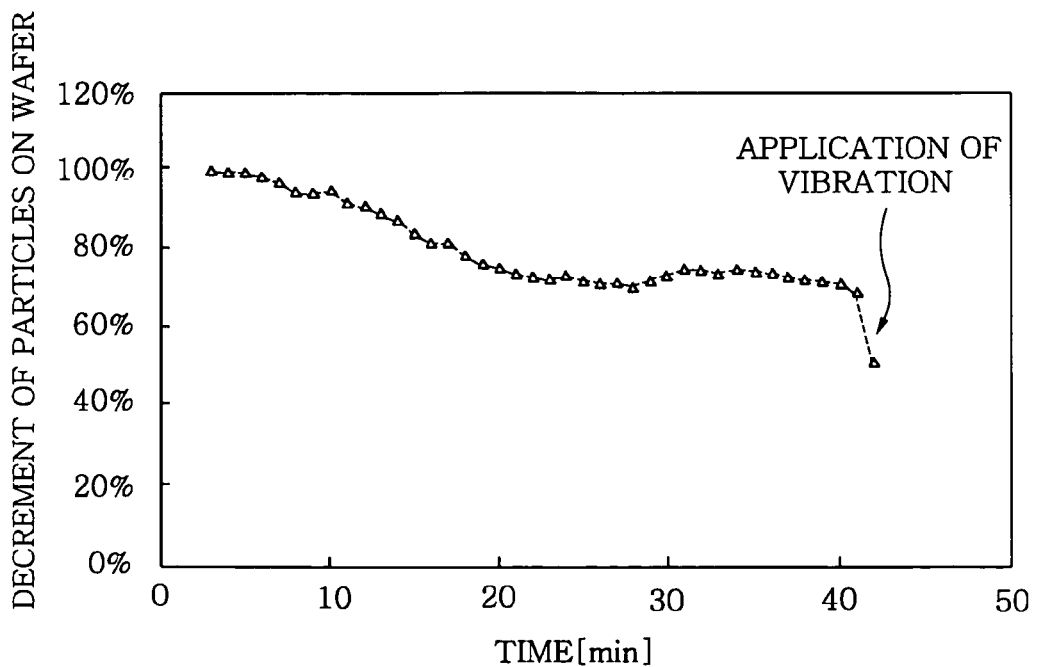
FIG. 14 depicts a graph showing relationships between a transferring time of the Si wafer in the chamber and a decrement of $SiO_2$ particles on the Si wafer, in the removal process of particles performed as an experimental example of the present invention.
Figure 15A:
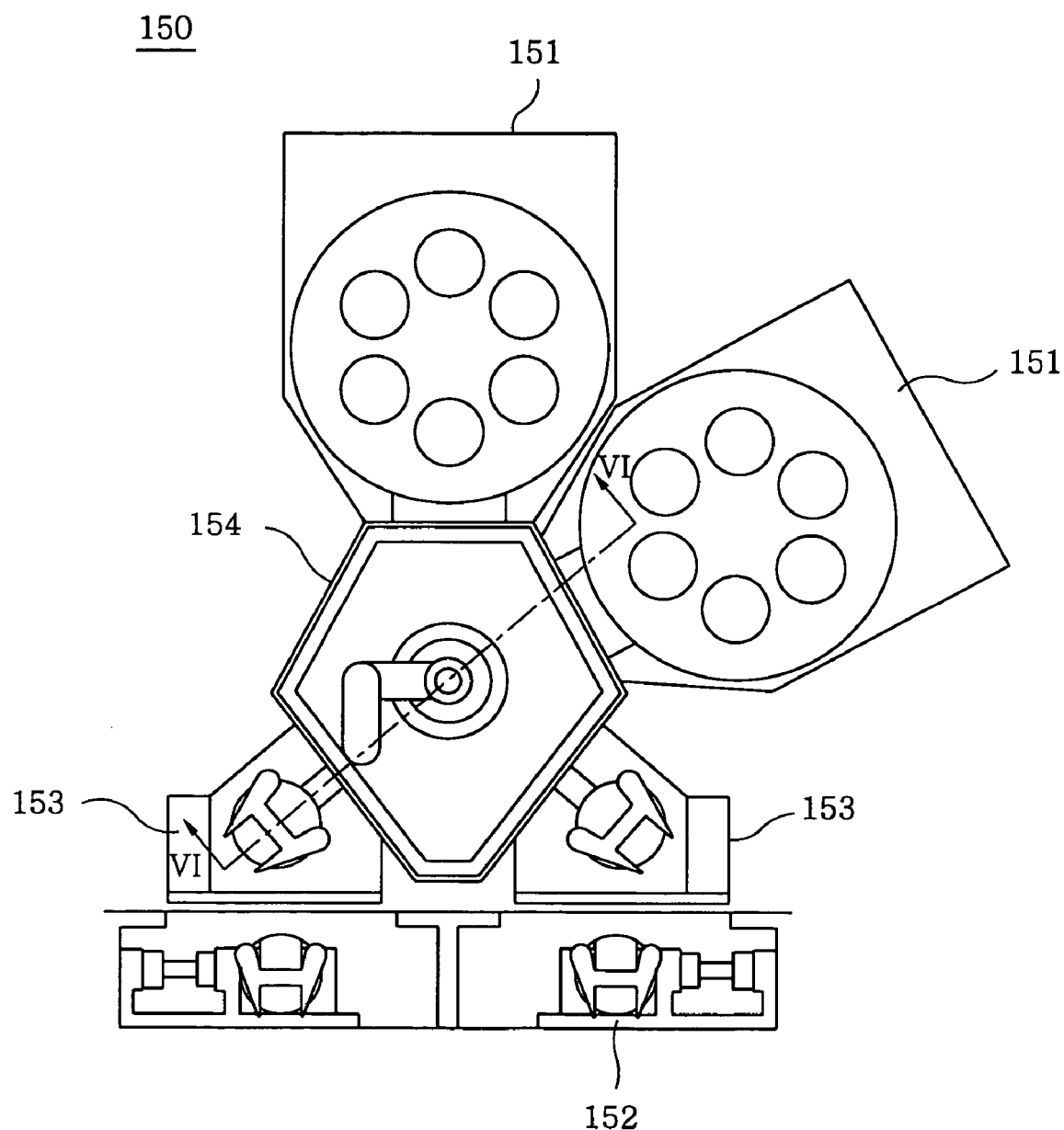
Figure 15B:
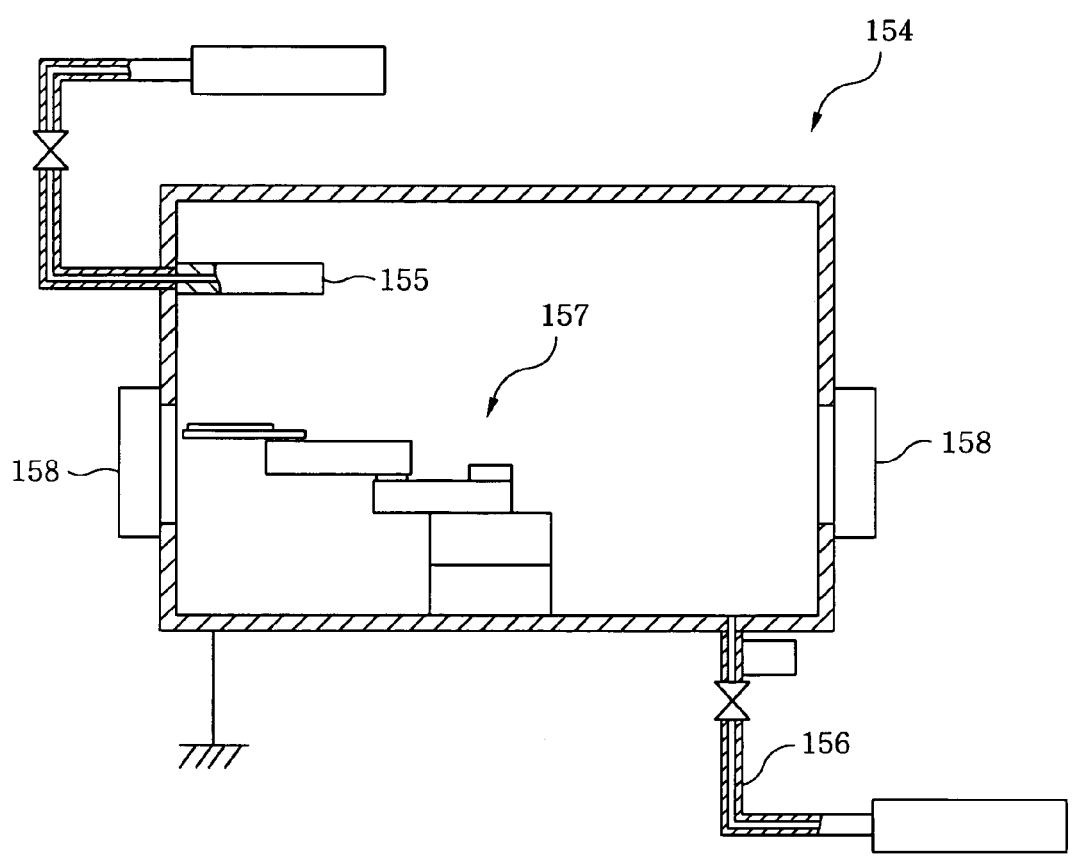

Further, in the processing chamber as the substrate transfer apparatus 30, as similarly to the above experimental example, after preparing a Si wafer whose surface had SiO$_2$ particles with a diameter of 0.6 μm attached thereto in advance, the Si wafer was mounted on the lower electrode. Thereafter, the Si wafer was mounted on the lower electrode for 40 minutes while the pressure in the processing chamber was controlled to be 1.3 kPa (10 Torr), and vibrations with a frequency of 40 kHz were applied to the Si wafer. At that time, the number of SiO$_2$ particles detached from the Si wafer was measured. The results are illustrated in FIG. 14.

By doing so, it was appreciated that a greater number of the SiO$_2$ particles could be detached from the Si wafer by applying ultrasonic vibrations to the Si wafer having the SiO$_2$ particles attached thereto.

While the invention has been shown and described with respect to the preferred embodiments, it will be understood by those skilled in the art that various changes and modification may be made without departing from the spirit and scope of the invention as defined in the following claims.

What is claimed is:

1. A particle removal method for a substrate transfer mechanism including a mount table on which a substrate is mounted and an arm member connected to the mounting table, the arm member moving the mounting table, the method comprising: a temperature control step of controlling temperature of the mounting table, wherein at the temperature control step, a temperature gradient is formed in the mounting table, wherein the mounting table has a surface layer formed of a specific material, and a linear expansion coefficient of the material of the surface layer is different from that of the particles produced in the vicinity of the mounting table so that a thermal stress is generated between the surface layer and the particles to detach the particles from the surface layer, wherein the temperature control step includes a detection step for detecting temperature of an environment and a heating step for heating the mounting table based on the temperature of the environment at the detecting step, wherein the method further includes a gas temperature control step of controlling temperature of a gas introduced into the environment based on the temperature in the environment detected at the detection step, and wherein at the temperature control step, the temperature of the mounting table is controlled to be kept at a temperature higher by at least 30K than that of the environment/chamber.

2. A particle removal method for a substrate transfer apparatus including a chamber for accommodating a substrate; a substrate transfer mechanism having a mounting table installed in the chamber, the substrate being mounted on the mounting table, and an arm member connected to the mounting table, the arm member moving the mounting table; an exhaust unit for exhausting the inside of the chamber; and a gas introduction unit for introducing a gas into the chamber, the method comprising:
a temperature control step of controlling temperature of the mounting table, wherein at the temperature control step, a temperature gradient is formed in the mounting table,
wherein the mounting table has a surface layer formed of a specific material, and a linear expansion coefficient of the material of the surface layer is different from that of the particles produced in the vicinity of the mounting table so that a thermal stress is generated between the surface layer and the particles to detach the particles from the surface layer,
wherein the temperature control step includes a detection step for detecting temperature in the chamber and a heating step for heating the mounting table based on the temperature in the chamber detected at the detecting step,
wherein the method further comprises a gas temperature control step of controlling temperature of a gas introduced into the chamber based on the temperature in the chamber detected at the detection step, and
wherein at the temperature control step, the temperature of the mounting table is controlled to be kept at a temperature higher by at least 30 K than that in the chamber.

3. The method of claim 2, further comprising a pressure control step of controlling pressure in the chamber.

4. The method of claim 3, wherein at the pressure control step, the pressure in the chamber is controlled to be 1.3× 10$^{-2}$~1.3 kPa (0.1~10 Torr).

5. A particle removal method for a substrate transfer apparatus including a chamber for accommodating a substrate, a mounting table installed in the chamber, the substrate being mounted on the mounting table, an exhaust unit for exhausting the inside of the chamber; and a gas introduction unit for introducing a gas into the chamber, the method comprising:
a temperature control step of controlling temperature of the mounting table,
wherein at the temperature control step, a temperature gradient is formed in the mounting table,
wherein the mounting table has a surface layer formed of a specific material, and a linear expansion coefficient of the material of the surface layer is different from that of the particles produced in the vicinity of the mounting table so that a thermal stress is generated between the surface layer and the particles to detach the particles from the surface layer,
wherein the temperature control step includes a detection step for detecting temperature in the chamber and a heating step of heating the mounting table based on the temperature in the chamber detected at the detecting step, wherein the method further comprises a gas temperature control step of controlling temperature of a gas introduced into the chamber based on the temperature in the chamber detected at the detection step, and wherein at the temperature control step, the temperature of the mounting table is controlled to be kept at a temperature higher by at least 30 K than that in the chamber.

6. The method of claim 5, further comprising a pressure control step of controlling pressure in the chamber.

7. The method of claim 6, wherein at the pressure control step, the pressure in the chamber is controlled to be $1.3 \times 10^{-2}$~$1.3$ kPa (0.1~10 Torr).

* * * * *